United States Patent
Derharcobian et al.

(10) Patent No.: US 7,675,765 B2
(45) Date of Patent: Mar. 9, 2010

(54) PHASE-CHANGE MEMORY (PCM) BASED UNIVERSAL CONTENT-ADDRESSABLE MEMORY (CAM) CONFIGURED AS BINARY/TERNARY CAM

(75) Inventors: Narbeh Derharcobian, Belmont, CA (US); Colin Neal Murphy, Belmont, CA (US)

(73) Assignee: Agate Logic, Inc., Cupertino, CA (US)

( * ) Notice: Subject to any disclaimer, the term of this patent is extended or adjusted under 35 U.S.C. 154(b) by 378 days.

(21) Appl. No.: 11/267,781

(22) Filed: Nov. 3, 2005

(65) Prior Publication Data
US 2007/0097740 A1     May 3, 2007

(51) Int. Cl.
G11C 15/04     (2006.01)
(52) U.S. Cl. .............. 365/49.17; 365/49.15; 365/49.1; 365/148; 365/163; 365/168; 365/190; 365/189.07; 365/203
(58) Field of Classification Search ........... 365/49, 365/148, 163, 168, 190, 195, 189.07, 203, 365/49.15, 49.17, 49.1
See application file for complete search history.

(56) References Cited

U.S. PATENT DOCUMENTS

| | | | |
|---|---|---|---|
| 5,761,115 A * | 6/1998 | Kozicki et al. ............ 365/182 |
| 6,304,477 B1 * | 10/2001 | Naji ........................... 365/50 |
| 6,317,349 B1 * | 11/2001 | Wong ......................... 365/49 |
| 6,987,688 B2 | 1/2006 | Lowrey et al. |
| 7,113,426 B2 | 9/2006 | Rueckes et al. |
| 7,129,749 B1 | 10/2006 | Fenstermaker et al. |
| 7,227,765 B2 * | 6/2007 | De Sandre et al. .......... 365/49 |
| 2004/0105301 A1 | 6/2004 | Toyoda et al. |
| 2004/0178401 A1 | 9/2004 | Ovshinsky et al. |
| 2004/0188668 A1 | 9/2004 | Hamann et al. |
| 2005/0062497 A1 | 3/2005 | Pellizzer et al. |
| 2005/0167645 A1 | 8/2005 | Kim et al. |
| 2006/0067097 A1 * | 3/2006 | Lien et al. .................. 365/49 |
| 2006/0071244 A1 | 4/2006 | Gutsche et al. |
| 2006/0097240 A1 | 5/2006 | Lowrey et al. |
| 2006/0102927 A1 | 5/2006 | Fujita et al. |

(Continued)

OTHER PUBLICATIONS

Kozicki et al., "Non-Volatile Memory Based on Solid Electrolytes", Center for Solid State Electronics Research, Nov. 2004, pp. 10-17.*

(Continued)

*Primary Examiner*—Andrew Q Tran
(74) *Attorney, Agent, or Firm*—James M. Wu; JW Law Group

(57) ABSTRACT

Content-addressable memory (CAM) cells comprised of phase change material devices (PCMDs), including PCMD-based binary CAM cells (PCMD-based BCAM cells), PCMD-based ternary CAM cells (PCMD-based TCAM cells), and PCMD-based universal CAM cells (PCMD-based UCAM cells). The PCMDs of the various PCMD-based CAM cells are configured and programmed in a manner that allows a logic "0" or a logic "1" to be stored by the CAM cell. The logic value stored by a given PCMD-based CAM cell depends on the program states of the PCMDs. A program state of a PCMD is determined by whether the phase change material of the PCMD has been allowed to solidify to a crystalline, low-resistance state during a programming operation, or whether the phase change material of the PCMD is forced to solidify to an amorphous, high-resistance state during the programming operation.

6 Claims, 29 Drawing Sheets

U.S. PATENT DOCUMENTS

2006/0279978 A1    12/2006    Krusin-Elbaum et al.
2007/0002608 A1*    1/2007    Hsu et al. .................. 365/163
2007/0097740 A1*    5/2007    Derhacobian et al. ....... 365/163

OTHER PUBLICATIONS

Hellemans, Alexander, News "A New Phase in Nonvolatile Memory?", IEEE Spectrum Jun. 2005, 1 page.

Lai, et al. OUM—A 180 nm Nonvolatile Memory Cell Element Technology For Stand Alone and Embedded Applications: Intel Corp., RN3-01 2200 Mission College Blvd Santa Clara, CA 95052-8119; 0-7803-7050-3/01/$10.00 © 2001 IEEE.

Kozicki et al. Nanoscale Memory Elements Based on Solid-State Electrolytes; IEEE Transactions on Nanotechnology, vol. 4, No. 3. May 2005; 1536-125x/$20.00 © 2005 IEEE.

Pellizzer et al. Novel μTrench Phase-Change Memory Cell for Embedded and Stand-Alone Non-Volatile Memory Applications; 0-7803-8289-7/04/$04/$20.00 © 2004 IEEE.

Maimon et al. Chalcogenide Memory Arrays: Characterization and Radiation Effects; IEEE Transactions on Nuclear Science, vol. 50, No. 6, Dec. 2003.

Axon Technologies Corp, "PMCm Technology Overview" © Copyright 2002 Axon Technologies Corporation.

Axon Technologies Corp, "How PMCm Works" © Copyright 2002 Axon Technologies Corporation.

Axon Technologies Corp, "List of Patents" © Copyright 2002 Axon Technologies Corporation.

"Introduction to PMCm" www.axontc.com; p. 1-3, 2002.

Axon Technologies Corp, "Scalability" © Copyright 2002 Axon Technologies Corporation.

Axon Technologies Corp, "Technical Papers" © Copyright 2002 Axon Technologies Corporation.

Axon Technologies Corp, "The ROADMAP" © Copyright 2002 Axon Technologies Corporation; p. 1-3.

Axon Technologies Corp, "What is PMCm?" © Copyright 2002 Axon Technologies Corporation; p. 1-3.

Axon Technologies Corp, "How PMCm Works" © Copyright 2002 Axon Technologies Corporation; p. 1-2.

Axon Technologies Corp, "Key Benefits" © Copyright 2002 Axon Technologies Corporation.

Kozicki et al. "Non-Volatile Memonry Based on Solid Electrolytes"; Center for Solid State Electronics Research Arizona State University, Nov. 2004, pp. 10-17.

Axon Technologies Corp, "Partnership Overview" © Copyright 2002 Axon Technologies Corporation; p. 1-2.

Kozicki et al., "Non-Volatile Memory Based On Soled Electrolytes"; Axon Technologies Corp © Copyright 2002 Axon Technologies Corporation.

* cited by examiner

| ROUTING TABLE | | |
|---|---|---|
| LINE NO. | ADDRESS | OUTPUT PORT |
| 1 | 101XX | A |
| 2 | 0110X | B |
| 3 | 011XX | C |
| 4 | 10011 | D |

| State | RDT | RDB |
|---|---|---|
| Stored DATA = "1" | SET (Low-R State) | RESET (High-R State) |
| Stored DATA = "0" | RESET (High-R State) | SET (Low-R State) |

FIGURE 9

| OPERATION | BLT | BLB | WL | DATA_PROG | Virt_VPP | COMMENT |
|---|---|---|---|---|---|---|
| RDT to High-R | 0 | VDD | Vprg_WL | Vprg_data | VPP | Fall time for DATA_PROG signal controlled so that PCM of RDT settles to RESET (High-R) state. |
| RDT to Low-R | 0 | VDD | Vprg_WL | Vprg_data | VPP | Fall time for DATA_PROG signal controlled so that PCM of RDT settles to SET (Low-R) state. |
| RDB to High-R | VDD | 0 | Vprg_WL | Vprg_data | VPP | Fall time for DATA_PROG signal controlled so that PCM of RDB settles to RESET (High-R) state. |
| RDB to Low-R | VDD | 0 | Vprg_WL | Vprg_data | VPP | Fall time for DATA_PROG signal controlled so that PCM of RDB settles to SET (Low-R) state. |

FIGURE 14

| State | RDT | RDB |
|---|---|---|
| Stored DATA = "1" | SET (Low-R State) | RESET (High-R State) |
| Stored DATA = "0" | RESET (High-R State) | SET (Low-R State) |

Masking Option: If MASK bit is ON, the cell is in a "Don't Care" state and the content of the cell is ignored or "masked off" from a global matching perspective. If the MASK bit is OFF, the cell behaves like a BCAM cell.

| State | RMT | RMB |
|---|---|---|
| MASK BIT OFF | SET (Low-R State) | SET (Low-R State) |
| MASK BIT ON | RESET (High-R State) | RESET (High-R State) |

FIGURE 18

| Operation | BLT | BLB | WL | DATA_PROG | Virt_VPP | MASK_PROG | Virtual MASK VPP | Comment |
|---|---|---|---|---|---|---|---|---|
| RDT to High-R | 0 | VDD | Vprg_WL | Vprg_data | VPP | VDD | VDD | Fall time for DATA_PROG controlled so that PCM of RDT settles to RESET (High-R) state. |
| RDT to Low-R | 0 | VDD | Vprg_WL | Vprg_data | VPP | VDD | VDD | Fall time for DATA_PROG controlled so that PCM of RDT settles to SET (Low-R) state. |
| RDB to High-R | VDD | 0 | Vprg_WL | Vprg_data | VPP | VDD | VDD | Fall time for DATA_PROG controlled so that PCM of RDB settles to RESET (High-R) state. |
| RDB to Low-R | VDD | 0 | Vprg_WL | Vprg_data | VPP | VDD | VDD | Fall time for DATA_PROG controlled so that PCM of RDB settles to SET (Low-R) state. |
| RMT to High-R | 0 | VDD | Vprg_WL | 0 | 0 | Vprg_MSK | VPP | Fall time for DATA_PROG controlled so that PCM of RMT settles to RESET (High-R) state. |
| RMT to Low-R | 0 | VDD | Vprg_WL | 0 | 0 | Vprg_MSK | VPP | Fall time for DATA_PROG controlled so that PCM of RMT settles to SET (Low-R) state. |
| RMB to High-R | VDD | 0 | Vprg_WL | 0 | 0 | Vprg_MSK | VPP | Fall time for DATA_PROG controlled so that PCM of RMB settles to RESET (High-R) state. |
| RMB to Low-R | VDD | 0 | Vprg_WL | 0 | 0 | Vprg_MSK | VPP | Fall time for DATA_PROG controlled so that PCM of RMB settles to SET (Low-R) state. |

FIGURE 21

| State | RDT | RDS |
|---|---|---|
| Stored DATA = "1" | SET (Low-R State) | RESET (High-R State) |
| Stored DATA = "0" | RESET (High-R State) | SET (Low-R State) |
| MASK BIT | RESET (High-R State) | RESET (High-R State) |

FIGURE 25

| Operation | BLT | BLB | Virtual WL | PRCHRG | WRITE CIRC. | Comment |
|---|---|---|---|---|---|---|
| RDT to High-R | Vprg | 0 | 0 | VDD | Apply VPP | Fall time for VPP controlled so that PCM of RDT settles to RESET (High-R) state. |
| RDT to Low-R | Vprg | 0 | 0 | VDD | Apply VPP | Fall time for VPP controlled so that PCM of RDT settles to SET (Low-R) state. |
| RDB to High-R | 0 | Vprg | 0 | VDD | Apply VPP | Fall time for VPP controlled so that PCM of RDB settles to RESET (High-R) state. |
| RDB to Low-R | 0 | Vprg | 0 | VDD | Apply VPP | Fall time for VPP controlled so that PCM of RDB settles to SET (Low-R) state. |

FIGURE 26

| Operation | BLT | BLB | Virtual WL | PRCHRG | WRITE CIRC. | Comment |
|---|---|---|---|---|---|---|
| READ | VDD | 0 | 0 | VDD | Tristate (Floating) | If RDT is in low-R state (data stored is a logic "1"), the ML will discharge quickly and this will be sensed by the sense amplifier connected to the ML. If RDT is in a high-R state (data stored is a logic "0"), the ML will discharge very slowly and the sense amplifier will register an opposite data compared to the previous case. |

FIGURE 27A

| Operation | BLT | BLB | Virtual WL | PRCHRG | WRITE CIRC. | Comment |
|---|---|---|---|---|---|---|
| READ | 0 | VDD | 0 | VDD | Tristate (Floating) | If RDB is in low-R state (data stored is a logic "0"), the ML will discharge quickly and this will be sensed by the sense amplifier connected to the ML. If RDB is in a high-R state (data stored is a logic "1"), the ML will discharge very slowly and the sense amplifier will register an opposite data compared to the previous case. |

FIGURE 27B

PHASE-CHANGE MEMORY (PCM) BASED UNIVERSAL CONTENT-ADDRESSABLE MEMORY (CAM) CONFIGURED AS BINARY/TERNARY CAM

FIELD OF THE INVENTION

The present invention relates to electronic memory. More specifically, the present invention relates to content-addressable memory that utilizes phase change material devices.

BACKGROUND OF THE INVENTION

Content-addressable memory (CAM) is a special type of memory that is used in high-speed search applications. Unlike standard random access memory (RAM) in which data is retrieved by applying an address location, a CAM searches its entire memory to determine whether an applied data word is stored anywhere in the CAM. If the data word is found, the CAM returns a list of one or more storage addresses where the data word was found. Accordingly, a CAM is the hardware embodiment of what in software terms would be called an "associative array". Because a CAM is designed to search its entire memory in a single operation, it is much faster than RAM in virtually all search applications.

CAM is used in a variety of applications including, for example, central processing unit (CPU) cache controllers, database engines, data compression, artificial neural networks, and computer networking. A typical computer networking application employs a CAM to implement a MAC (Media Access Control) address table in a network router. When the network router receives a data packet at one of its ports, the network updates a CAM-based table with the packet's source MAC address and the port the packet was received on. The destination address is then searched for in the table, to determine what port the data packet needs to be forwarded to.

There are two basic types of CAMs: the binary CAM (BCAM) and the ternary CAM (TCAM). The BCAM is the simplest CAM type. In a BCAM, logic "1" and logic "0" matches are sought for the data that is being compared. In a TCAM, a third logic value, namely, "don't care" can also be used. The "don't cares" in a TCAMs provide the capability of "masking out" bits locally on a bit-by-bit basis (i.e., internal masking). The "don't cares" also allow the entire input/output or one or more CAM columns to be masked out ("global" masking), without requiring the memory logic to perform the compare function for the masked out data.

FIG. 1A is a block diagram of a typical prior art 4×5 bit CAM 10 used in a networking application. The 4×5 CAM 10 comprises an array of CAM cells 100 arranged as four horizontal words, each word being five bits long. The CAM cells 100 contain both storage and comparison circuitry. Search lines 102 run vertically between columns of CAM cells 100 and are used to receive the data to be compared (referred to in the art as "the comparand") to the CAM cells 100. Matchlines 104 run horizontally between the horizontal words, and indicate whether the bits of the comparand match the bits stored in the CAM cells of any one of the horizontal words. The matchlines 104 may be coupled to inputs of an encoder 106 to generate an address corresponding to a matched word.

FIG. 1B shows a routing table containing a list of destination addresses and corresponding ports, which is implemented in the CAM array shown in FIG. 1A. All four entries in the table are 5-bit words matching both a logic "0" and a logic "1" in that position. Don't care bits are represented by an "X". Because of the X bits, each of the first three entries in the table represents a range of input addresses. For example, the entry on Line 1 indicates that all addresses within the range $10100_2$-$10111_2$ are forwarded to port A.

A CAM search operation begins with precharging all matchlines 104, thereby placing them all temporarily in a match state. Next, the search line drivers 108 drive the search data (i.e. comparand "01101" in the figure) onto the search lines 102. Each CAM cell 100 compares its stored bit against the bit on its corresponding search lines 102. Cells with matching data do not affect the cell's corresponding matchline 104 but cells with a mismatch pull down their corresponding matchlines 104. Cells storing an X operate as if a match has occurred. The aggregate result is that matchlines 104 are pulled down for any word that has at least one mismatch. All other matchlines 104 remain activated (i.e. remain in their precharged). For example, as shown in FIG. 1A, the two middle matchlines 104 remain activated (indicating a match), while the other matchlines 104 discharge to ground, indicating a mismatch. Finally, the encoder 106 generates the search address location of the matching data. In the example, the encoder 106 numerically selects the smallest numbered matchline 104 of the two activated matchlines, generating the match address "01". This match address is used as the input address to a RAM 20 that contains a list of output ports as depicted in FIG. 2. The match address output of the CAM 10 is used as a pointer, which is used to retrieve associated data from the RAM 20.

The CAM/RAM search can be viewed as a dictionary lookup where the search data is the word to be queried and the RAM contains the word definitions. The router searches for the destination address of each incoming packet in the address lookup table to find the appropriate output port. For example, if the router receives a packet with the incoming address 01101, the address lookup matches both Line 2 and Line 3 in the table. Line 2 is selected since it has the most defined bits, indicating it is the most direct route to the destination.

Prior art CAMs are normally comprised of conventional semiconductor memory (e.g. static random access memory (SRAM)) and comparison circuitry, which enables a search operation to be completed in a single clock cycle. FIG. 3 is a schematic diagram of a prior art BCAM cell 30. The BCAM cell 30 includes a six-transistor (6T) SRAM 300 comprised of two cross-coupled inverters 301 (two transistors each) and two access transistors 302, 304, which are used to read and write the SRAM 300. The access transistors 302, 304 connect the bitlines, BLT and BLB, which are logical complements of one another (i.e. bitline true (BLT) and bitline bar (BLB)), to the storage nodes (QT and QB) of the two cross-coupled inverters 300. The gates of the access transistors 302, 304 are coupled to a wordline (WL).

A CAM cell operates by comparing input data (i.e. the comparand) to the data bit stored in the SRAM. As explained above, CAM cells are typically formed in an array. Each wordline (WL) has a global signal usually referred to as the matchline (ML) associated with it. If there is a match between the data being compared (i.e. the "comparand") and all of the data bits stored in the array, the corresponding ML will remain high, i.e., will remain in a charged state. If there is a miss to any one bit that is being compared in a row (i.e. there is a mismatch), the corresponding ML to that row will discharge.

Assume for the sake of discussion that the BCAM cell 30 is in static mode (i.e. a mode during which data is not being compared, stored or read from the SRAM cell 300), and that the SRAM 300 has been previously programmed to store a logic "1". With a logic "1" stored in the SRAM 300, node QB is at 0V (logic "0") and node QT is at VDD (logic "1"). As a result, transistor 306 is ON and transistor 308 is OFF. Also assume that in static mode, the match line (ML) has also been properly precharged to VDD. Under these conditions, since both bit lines (BLT and BLB) are at 0V, ML is held at the precharged voltage (VDD for example). (Note that in some implementations, BLT and BLB could be precharged to VDD, in which case the source of transistor 310 is also coupled to VDD to maintain the ML high condition in the static mode.)

During a compare operation, the comparand data is inverted and input on the BLT and BLB lines. Assuming again that the data stored in the SRAM 300 is a logic "1", then if the comparand is also a logic "1", BLT will be at 0V and BLB will be at VDD (remember that the comparand data is inverted). Accordingly, during the compare operation, transistor 310 will be OFF and the ML will remain charged up to its precharged state, thereby indicating a match if the comparand. On other hand, if during a compare operation the data stored in the SRAM 300 is a logic "1", and the comparand is a logic "0", both transistors 306 and 310 are ON and the ML discharges to ground, thereby indicating a miss (i.e. a mismatch of the comparand).

As explained above, typically a CAM array is formed from a plurality of rows of CAM cells. In such a configuration, each row of the array has a common ML, and for each row a multi-bit data comparand is compared to a plurality of data bits stored in the SRAMs of the CAM cells in the row. Accordingly, for the entire length of a given row, if all the bits match the corresponding bits in the comparand, then ML will remain high, thereby indicating a match. If any one of the bits does not match the data store in the corresponding SRAM cell, then the ML for that row will discharge to a logic low level, thereby indicating a mismatch.

FIG. 4 is a schematic diagram of a ternary CAM cell (or "TCAM" cell) 40. The TCAM cell 40 is similar to the BCAM cell 30 shown in FIG. 3, but also includes an additional SRAM cell 400, which is configured to store a don't care bit. The additional SRAM cell 400 implements what is commonly referred to as a "mask bit". When the SRAM cell 400 is programmed to store a logic "1", the pull down transistor 402 will always be OFF, irrespective of the data stored in the first SRAM cell 300. Accordingly, under such conditions, the ML will always remain in its precharged state, thereby indicating a don't care during a compare operation.

While prior art BCAMs and TCAMs have come into widespread use, they are plagued with various drawbacks. First, prior art CAMs consume large amounts of both dynamic and static power. Second, prior art CAMs occupy a large area. This large area requirement is mostly attributable to the large areas needed to form the SRAM cells. Third, SRAM-based CAMs are susceptible to radiation induced soft errors. It would be desirable, therefore, to have an improved CAM cell structure that is not plagued with the drawbacks characteristic of SRAM-based CAMs.

SUMMARY OF THE INVENTION

Content-addressable memory (CAM) cells comprised of phase change material devices (PCMDs) are disclosed. According to one aspect of the invention, binary CAM (BCAM) cell includes two PCMDs, which are configured and programmed in a manner that allows a logic "0" or a logic "1" to be stored. The logic value stored by the BCAM depends on the program states of the two PCMDs. A program state of a particular PCMD is determined by whether the phase change material of the PCMD has been allowed to solidify to a crystalline, low-resistance state during a programming operation, or whether the phase change material of the PCMD is forced to solidify to an amorphous, high-resistance state during the programming operation.

According to other aspects of the invention, exemplary PCMD-based ternary CAMs, and a universal PCMD-based CAM capable of operating as either a BCAM or a TCAM, depending on the program states of its PCMDs, are described and claimed.

Unlike the SRAM-based CAMs of the prior art, the PCMD-based CAMs of the present invention are non-volatile, essentially incapable of generating errors caused by background radiation, and are small in area. They are also reconfigurable, and because of their relatively small size and lack of need from SRAM cells, consume substantially less power than SRAM-based CAMs.

Other aspects of the inventions are described and claimed below, and a further understanding of the nature and advantages of the inventions may be realized by reference to the remaining portions of the specification and the attached drawings. The same reference indicators will be used throughout the drawings to refer to the same or similar parts.

BRIEF DESCRIPTION OF THE DRAWINGS

FIG. 9 is a table showing the program states of the PCMDs in the BCAM cell of FIG. 5 when a logic "1" is stored in the BCAM cell and, alternatively, when a logic "0" is stored in the BCAM cell;

FIG. 14 is a table showing programming voltages used to program the PCMDs of the BCAM cell in FIG. 5 to either high-resistance or low-resistance states;

FIG. 18 is a table showing the program states of the PCMDs in the TCAM cell of FIG. 17, when a logic "1" is stored in the TCAM cell, when a logic "0" is stored in the TCAM cell, and the states of the mask bit PCMDs required to turn a mask bit ON and OFF;

FIG. 20 is a simulation timing diagram showing exemplary waveforms applied to and generated by the TCAM cell of FIG. 17 during a compare operation when the mask bit is ON;

FIG. 21 is a table showing programming voltages used to program the PCMDs of the TCAM cell of FIG. 17 to either high-resistance or low-resistance states;

FIG. 25 is a table showing the program states of the PCMDs in the UCAM cell of FIG. 24, when a logic "1" is stored in the UCAM cell, when a logic "0" is stored in the UCAM cell, and the states of PCMDs employed to implement a mask bit function;

FIG. 26 is a table showing programming voltages used to program the PCMDs of the UCAM cell of FIG. 24 to either high-resistance or low-resistance states;

FIG. 27A is a table illustrating the voltages applied to the UCAM cell of FIG. 24 to read the content of the UCAM cell through the BLT line;

FIG. 27B is a table illustrating the voltage applied to the UCAM cell of FIG. 24 to read the content of the UCAM cell through the BLB line;

DETAILED DESCRIPTION

Figure 5:
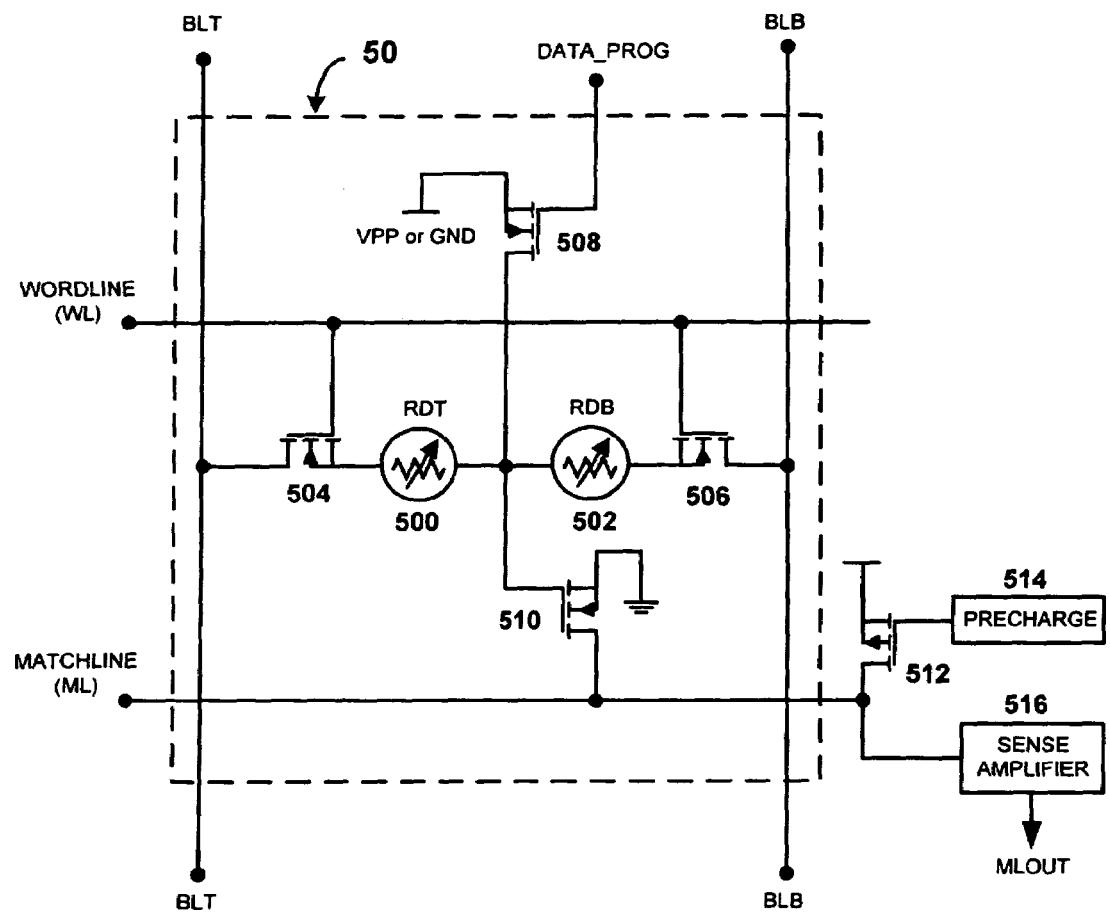
FIG. 5 is a schematic diagram of a BCAM cell, according to an embodiment of the present invention.

Referring to FIG. 5, there is shown a schematic diagram of a binary content-addressable memory (BCAM) cell 50, according to an embodiment of the present invention. The BCAM cell 50 comprises first and second phase change material (PCM) devices 500, 502 (referred to herein as "PCMDs") coupled to access transistors 504, 506, respectively, a programming transistor 508, and a matchline charge control transistor 510. The access transistors 504, 506 have gates coupled to a wordline (WL) and drains coupled to bitlines BLT (bitline true) and BLB (bitline bar). As shown, the ML of the BCAM cell 50 is coupled to a precharge pull-up transistor 512, which is controlled by precharge control input 514, and a sense amplifier 516.

Figure 6:
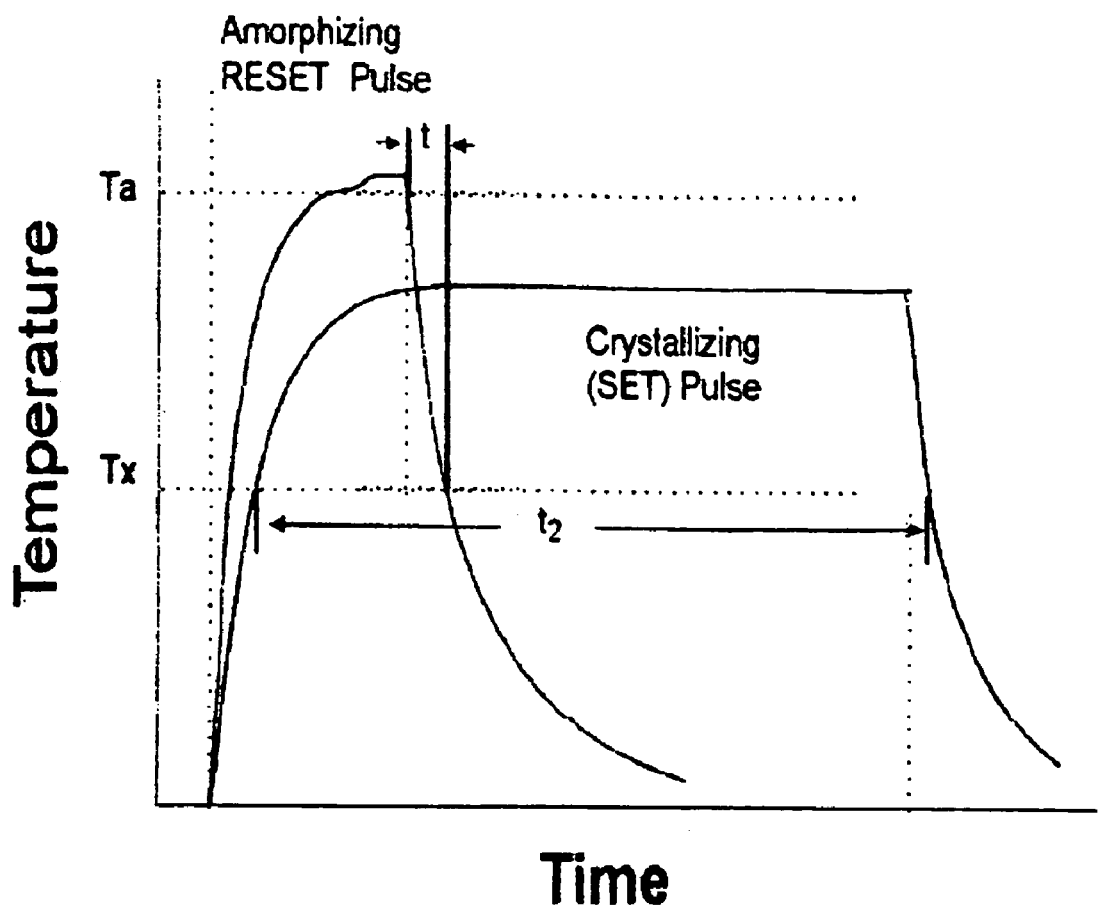
FIG. 6 is a temperature profile for crystalline (low-resistance) and amorphous (high-resistance) phases of a phase change material (PCM), where Ta and Tx represent the melting and crystallization temperatures of the PCM, and t1 and t2 indicate times for controlling amorphous and crystallization state formation.

According to an aspect of the invention, the PCMDs 500, 502 employed in the BCAM cell 50 (and other PCMDs employed in other embodiments of the invention) are formed from a class of chalcogenic materials that contain atomic elements from Groups IV, V and VI of the periodic table of elements (e.g. Ge, As, Se, Te). Such chalcogenic materials change phase from a crystalline state to an amorphous state or back when under different thermal treatments as shown in FIG. 6. When the PCM of either one of the PCMDs 500, 502 is heated above its crystallization temperature and cooled down gradually, it solidifies to a crystalline phase and exhibits low electrical resistance. On the other hand, when heated above its melting temperature and then cooled down abruptly, the PCM solidifies to an amorphous phase and exhibits high electrical resistance.

Figure 7:
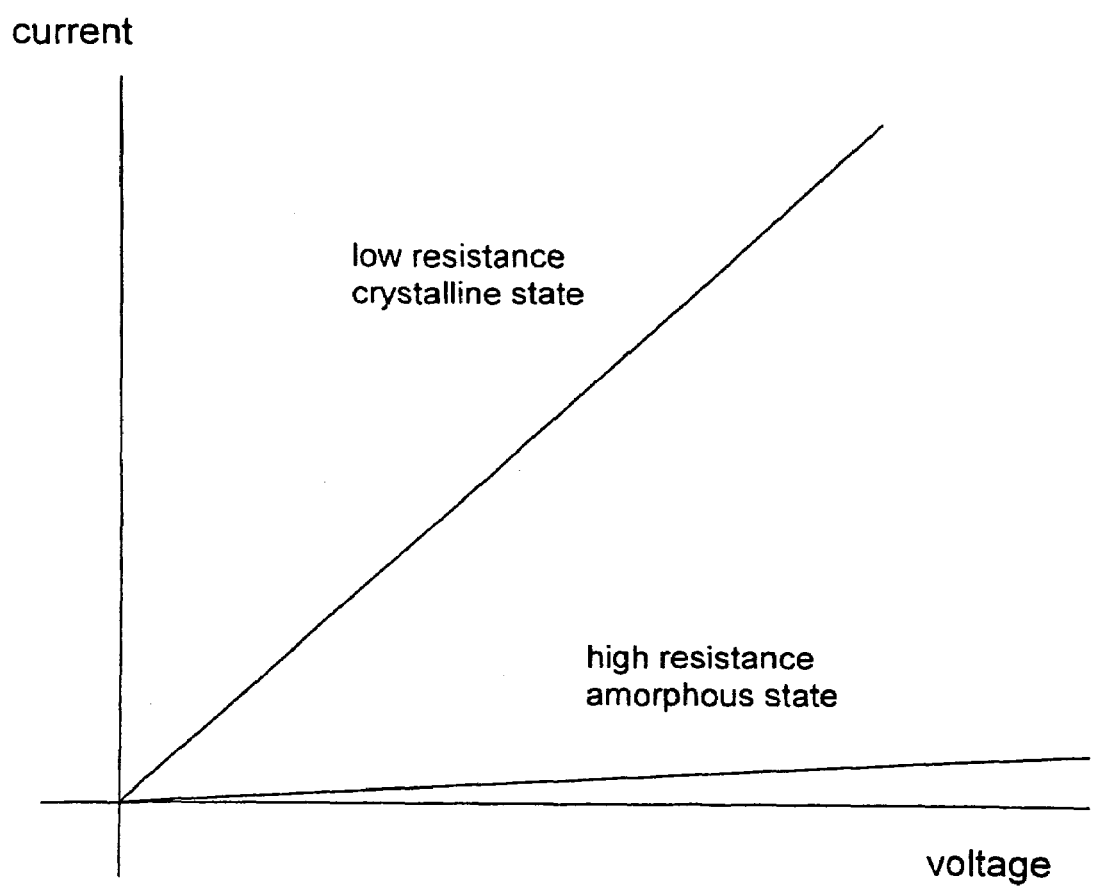
FIG. 7 is a graph showing the I-V characteristics of a PCM for both crystalline (low-resistance) and amorphous (high-resistance) states.

When the PCMDs 500, 502 are configured in the BCAM cell 50 as shown in FIG. 5, the PCMDs 500, 502 may be programmed using electric currents to introduce joule heating to the PCM, in order to place the PCMDs 500, 502 into either one of the crystalline or amorphous states. In other words, a reversible phase change places the PCMDs 500, 502 into a high-resistance (RESET) or a low-resistance (SET) state, depending on the control of a current forced through and/or a voltage applied across the PCM. As shown in FIG. 7, the PCMDs 500, 502 may be viewed as programmable resistors (indicated by the resistor symbols with the arrows crossing through them in FIG. 5) having two distinct electrical resistance values.

Figure 8:
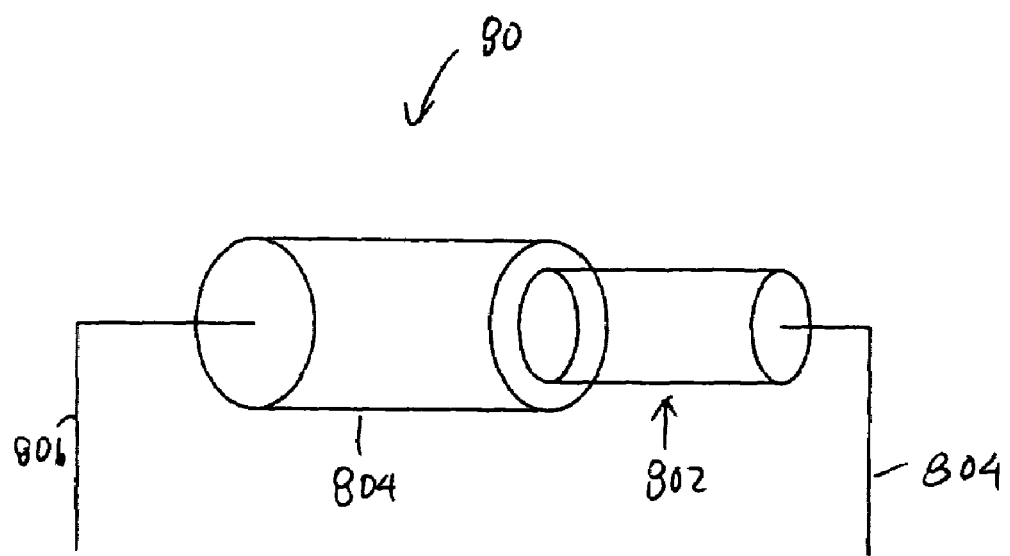
FIG. 8 is a simplified diagram of a PCM device (PCMD) having a heater element coupled to a PCM component.

FIG. 8 is simplified diagram of a PCMD 80, which can be used to implement the PCMDs 500, 502 of the BCAM cell 50 in FIG. 5. A heater element 802 is attached to a first terminal 804 of the device 800, and a phase change material 804 is attached to a second terminal 806 of the device 800. Electrical currents passed through the heater element 802 generate joule heating required to make the phase change. Further details and examples as to how such a phase change device may be constructed are described in S. Lai, T. Lowrey, "OUM—A 180 nm nonvolatile memory cell element technology for stand alone and embedded applications", 2001 IEDM Technical Digest, pp. 36.5.1-36.5.4; J. Maimon, J. D., K. Hunt, L. Burcin, J. Rodgers, "Chalcogenide memory arrays: characterization and radiation effects", IEEE Transactions on Nuclear Science, v. 50, n. 6, 2003, pp. 1878-1884, December 2003; and F. Pellizzer et al., "Novel µtrench phase-change memory cell for embedded and stand-alone non-volatile memory applications", 2004 Symposium on VLSI Technology Digest of Technical Papers, pp. 18-19, which are incorporated herein by reference to the extent that they do not conflict with this disclosure.

Figure 10:
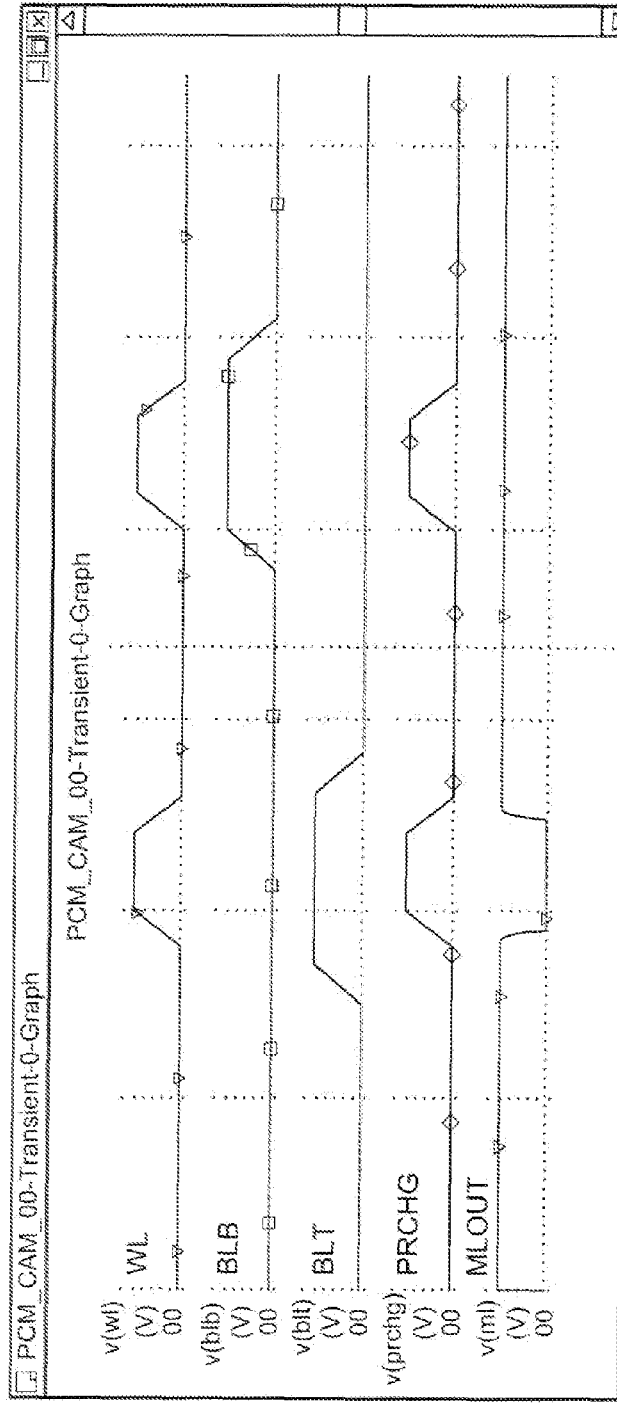
FIG. 10 is a simulation timing diagram showing exemplary waveforms applied to and generated by the BCAM cell of FIG. 5 during compare operations when a logic "1" is stored in the BCAM cell.

FIG. 9 is a table showing the program states of the PCMDs in the BCAM cell of FIG. 5 when a logic "1" is stored in the BCAM cell 50 and, alternatively, when a logic "0" is stored in the BCAM cell 50. When a logic "1" is stored, the first PCMD 500 has been programmed to a low-resistance state (SET) and the second PCMD 502 has been programmed to a high-resistance state (RESET). That a logic "1" is stored in the BCAM cell can be confirmed by performing a compare operation of input data applied to the BLT and BLB lines. First, consider comparing a data input having a logic "0" to the stored logic "1". Note that a data input (i.e. comparand) having a logic "0" is represented by a logic "1" being applied to the BLT line and a logic "0" being applied to the BLB line. FIG. 10 (more specifically, the left-half portion of FIG. 10) is a timing diagram illustrating such a comparison. At the start of the compare operation, the word line (WL) is raised to a logic high level. With a logic "1" applied to BLT and a logic "0" applied to BLB, access transistor 504 is ON. Because the first PCMD 500 had been previously programmed to a low-resistance state (see table in FIG. 9), the logic high on BLT is passed to the gate of the matchline charge control transistor 510. (Note that because the second PCMD 502 had been previously programmed to a high-resistance state (i.e. to essentially an open circuit state), the data input on the BLB line cannot pass to the gate of the matchline charge control transistor 510.) The logic high at the gate of the matchline charge control transistor 510 causes the matchline charge control transistor 510 to turn ON, and the ML begins to discharge to ground. As the ML discharges, the sense amplifier 516 senses the drop and responds by driving the ML to a full swing logic "0". A logic "0" on the ML indicates that the data input of logic "0" is a mismatch to the logic "1" stored in the BCAM cell 50

By contrast, when a logic "1" data input (BLT at logic "0" and BLB at logic "1") is compared to the logic "1" stored in the BCAM cell 50, the gate of matchline charge control transistor 510 receives a logic low value (via first access transistor 504 and low-resistance first PCMD 500), which is insufficient to turn the matchline charge control transistor 510 ON. In other words, the ML is left floating to its precharged state, which is a state indicative of a match. (See right-half portion of FIG. 10.)

Similar compare operations can be performed when a logic "0" is stored in the BCAM cell 50. Under such conditions, the first PCMD 500 has been programmed so that it is in a high-resistance state and the second PCMD 502 has been programmed so that it is in a low-resistance state (see table in FIG. 9). The compare operations proceed similar to that when a logic "1" is stored in the BCAM cell 50, except that the ON/OFF condition of the second access transistor 506 determines whether the matchline charge control transistor 510 is turned ON or OFF, rather than does the first access transistor 504.

Figure 11:
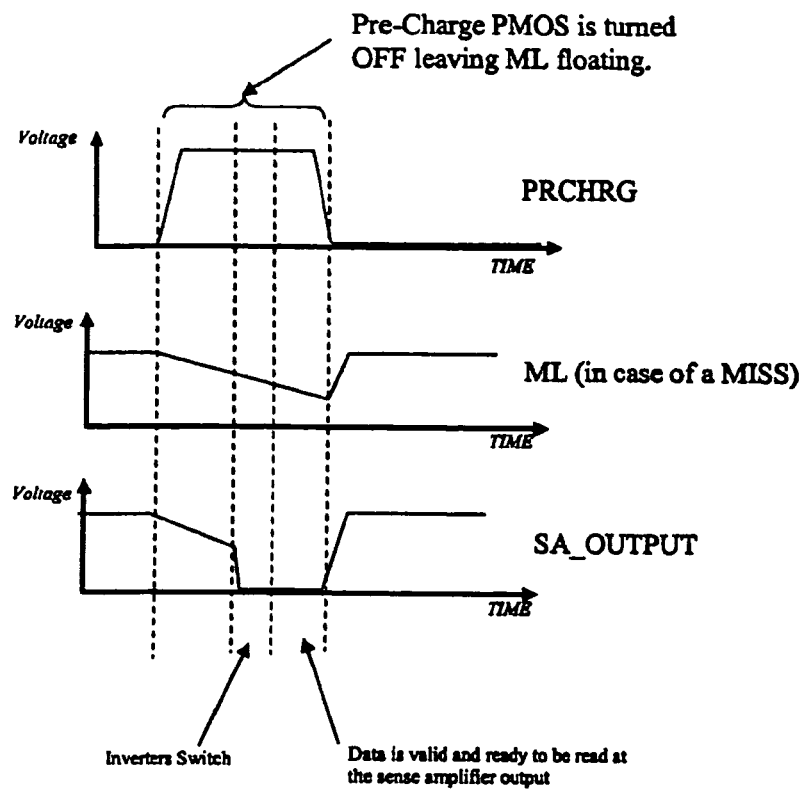
FIG. 11 is a timing diagram illustrating operation of the sense amplifier employed in the BCAM cell shown in FIG. 5.

Each of the compare operations described above requires that the ML be precharged to a logic "1" prior to performing the actual compare operation. There are a number of approaches that can be used to implement the precharging function (see FIG. 10). One approach is to couple a PMOS transistor 512 to the match line as shown in FIG. 5. When the precharge control input 514 is at ground, the PMOS transistor 512 holds the ML at VDD. Immediately prior to the compare operation, the precharge control input is set to VDD, thereby turning the PMOS transistor 512 OFF. This places the ML in a floating condition and in a precharged state. As described above, during the compare operation, the ML will either discharge low or will be maintained at a level close to VDD, depending on the whether the compare operation determines a match or a mismatch in data being compared to the data stored in the BCAM cell 50. As shown in FIG. 11, the sense amplifier 516 (see FIG. 5) will sense a "drop" in the ML voltage level, and will convert the sensed "drop" to either a full logic "1" or to a full logic "0" level.

Figure 12:
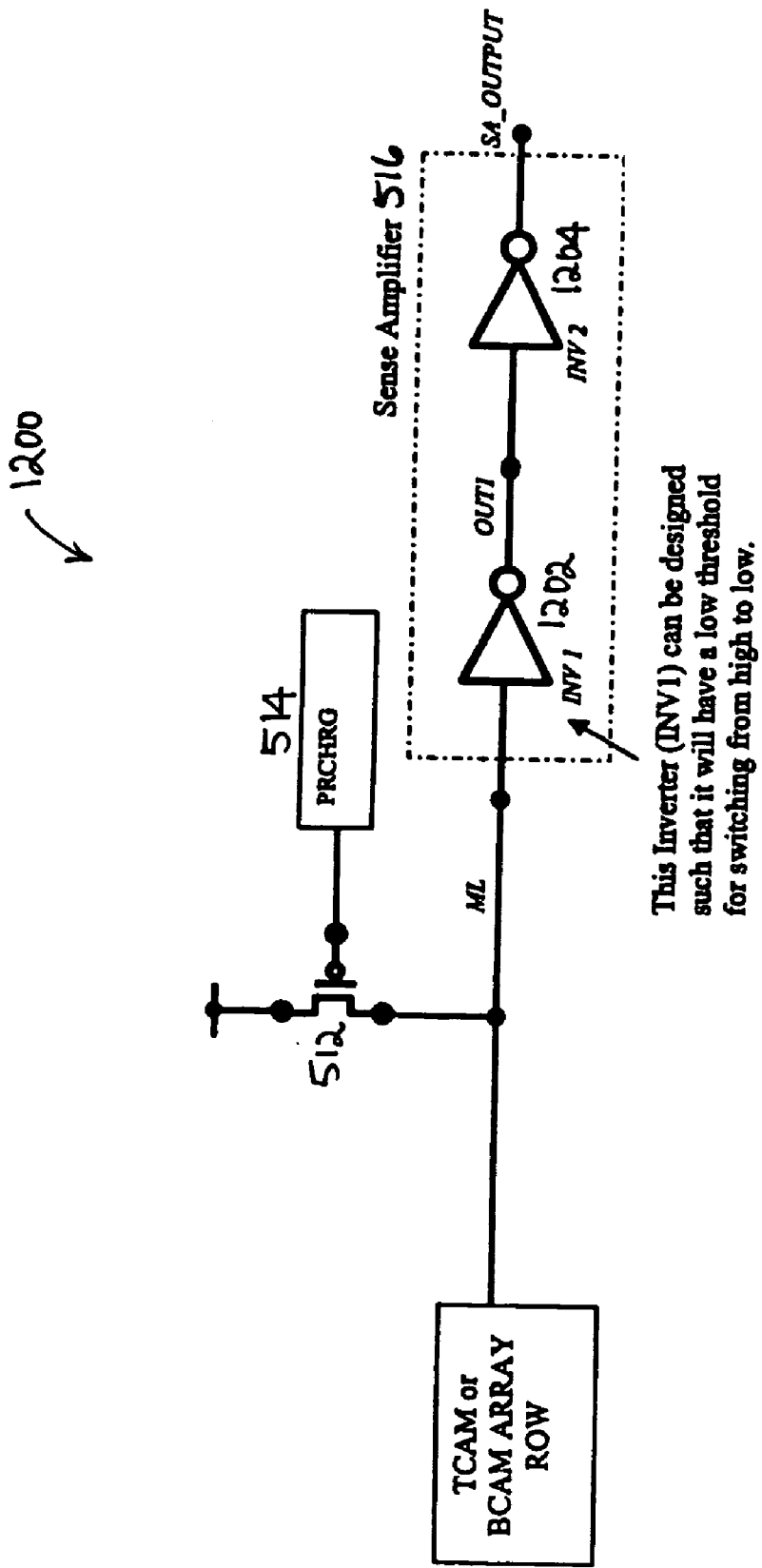
FIG. 12 is a schematic drawing of a precharge and sense amplifier circuit, which can be used in the BCAM cell shown in FIG. 5.

FIG. 12 is a schematic diagram of a precharge and sense amplifier circuit 1200 that can be used in the BCAM cell 50 shown in FIG. 5. The sense amplifier 516 is comprised of first and second inverters 1202, 1204 coupled in series. The first inverter 1202 is designed so that it has a low threshold for switching between logic "0" and logic "1" states. The second inverter 1204 inverts the output of the first inverter 1202 and amplifies it to the appropriate full-swing logic "0" or logic "1" state, depending on the results of the compare operation.

Figure 13:
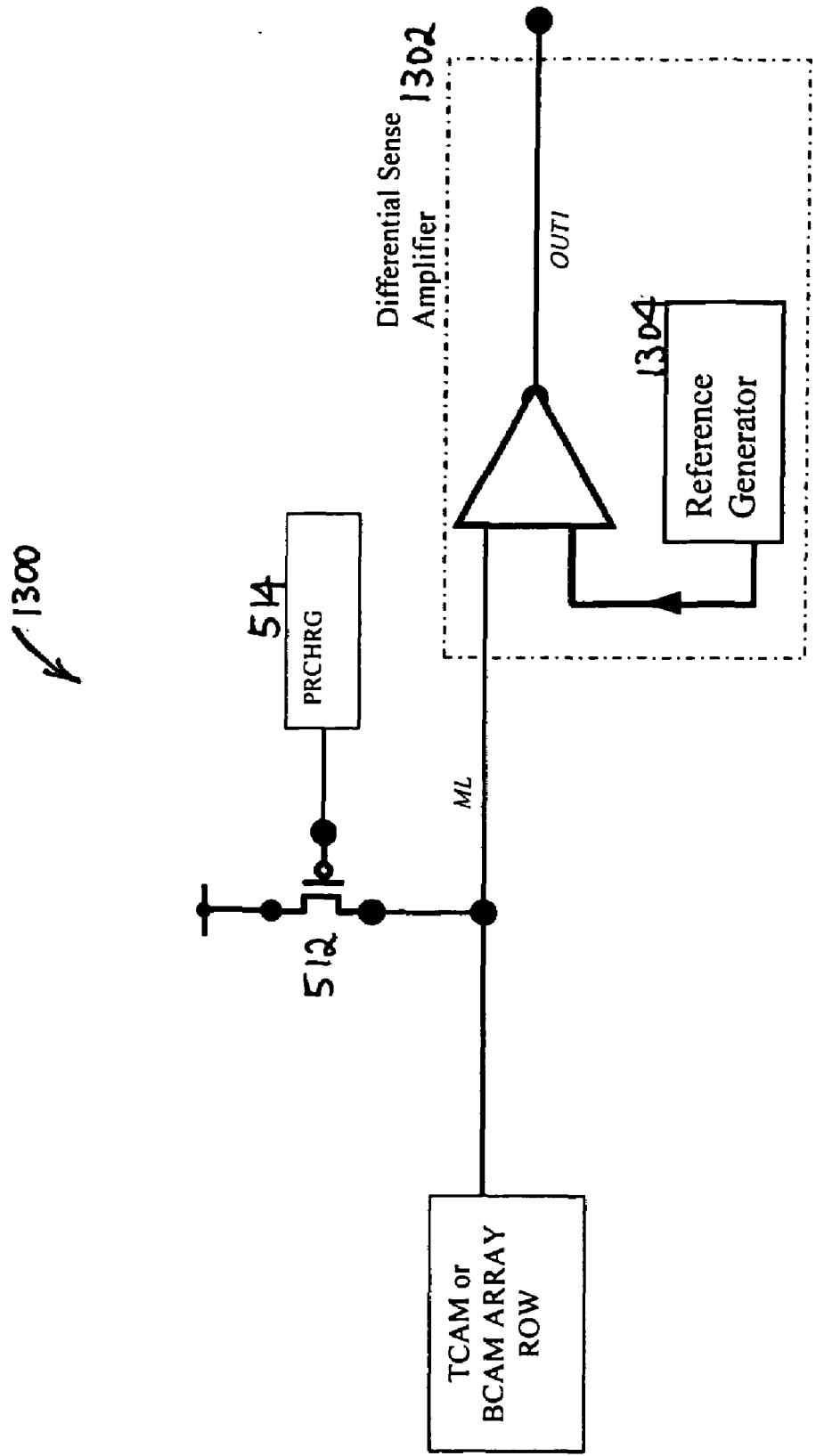
FIG. 13 is a schematic drawing of an alternative precharge and sense amplifier circuit, which can be used in the BCAM cell shown in FIG. 5.

FIG. 13 is a schematic drawing of an alternative precharge and sense amplifier circuit 1300 that can be used in the BCAM cell 50 shown in FIG. 5. According to this implementation, a differential sense amplifier 1302 is employed. During a compare operation, the voltage on the ML is compared to a reference voltage provided by a reference generator 1304. If the ML voltage is determined to fall below the reference voltage level, the differential sense amplifier 1302 will output a logic "0". On the other hand, if the ML voltage remains above the reference voltage level, the sense amplifier will output a logic "1". While FIGS. 12 and 13 show two possible alternative precharge and sense amplifier circuits, those of ordinary skill in the art will readily appreciate and understand that those two alternatives are but two of many possible alternatives. Accordingly, the operation and structure of the various PCMD-based CAMs set forth in this disclosure should not be viewed as being restricted to use of either of those two exemplary precharge and sense amplifier circuits. Various other possible precharge and amplifier circuit implementations may be used, as will be appreciated and understood by those of ordinary skill in the art.

FIG. 14 is a table showing programming voltages used to program the PCMDs of the BCAM cell in FIG. 5 to either high-resistance or low-resistance states. For example, to program the first PCMD 500 (referred to as "RDT" in the table) to a high-resistance (i.e. RESET) state, BLT is coupled to ground (i.e. 0 volts), BLB is coupled to VDD, WL is coupled to a programming voltage (Vprg_WL), the DATA_PROG input (gate of the programming transistor 508) is configured to receive a PCMD programming signal (Vprg_data), and the source of the programming transistor 508 is coupled to ground or other voltage (e.g. VPP). Under these conditions, the first access transistor 504 is ON, and a ground path is provided by the BLT line. During programming, after sufficient joule heating has been applied to the PCM of the first PCMD 500, the Vprg_data signal is quickly ramped down. The quick ramping results in the PCM of the first PCMD 500 solidifying to an amorphous, high-resistance (i.e. RESET) state. To program the first PCMD 500 to a low-resistance (i.e. SET) state, similar bias and programming voltages are applied to the BCAM cell 50, except that instead of allowing the Vprg_data signal to ramp down quickly, it is slowly ramped down so that the PCM of the first PCMD 500 crystallizes to a low-resistance state. (See FIGS. 6-8 and accompanying description above.)

In addition to the compare operations describe above, the data stored in the BCAM cell 50 can also be read using substantially the same principles used to read 6T SRAM-based CAMs. Depending on the content of the BCAM cell 50 (determined by the program states of the first and second PCMDs 500, 502; see discussion above), the BLT or BLB lines will discharge once the WL is turned ON (Data_Prg is set to VDD and the virtual VPP input to the programming transistor 508 is set to GND). This voltage drop can be sensed by common sense amplifiers used in conventional SRAM circuits, as will be readily appreciated and understood by those of ordinary skill in the art.

Figures 1A, 1B:
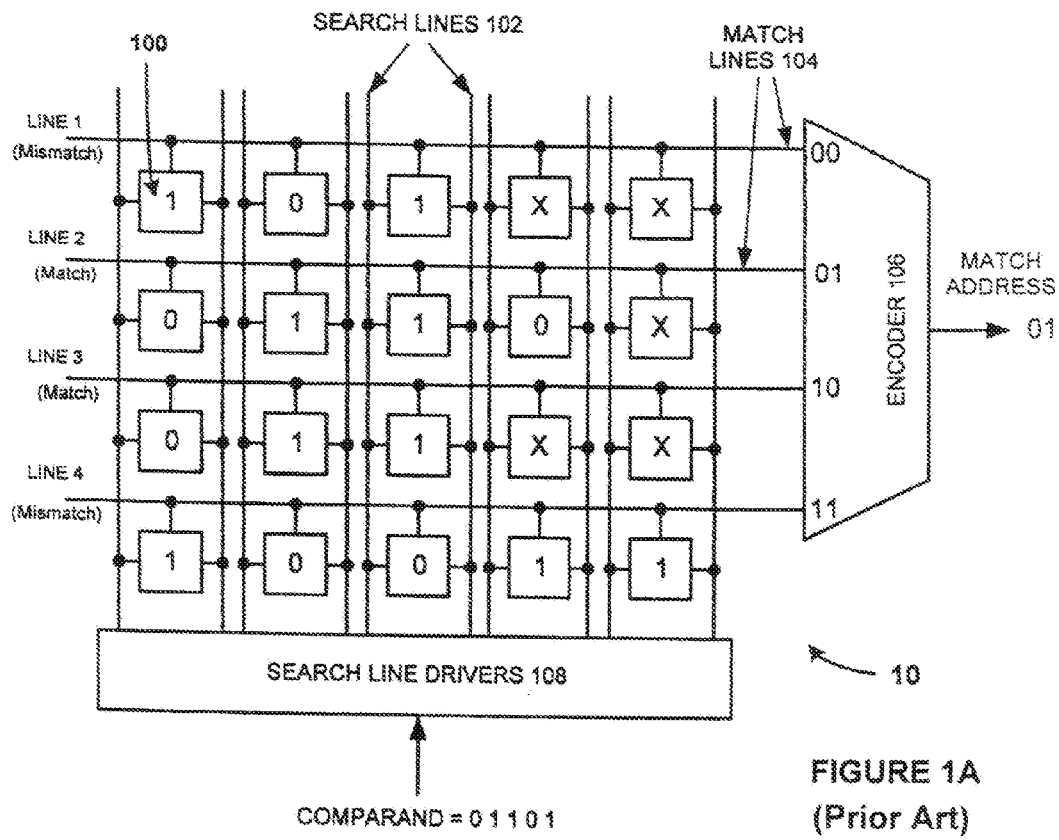
FIG. 1A is a block diagram of a prior art 4×5 bit CAM array commonly used in networking applications.
FIG. 1B is a routing table that is implemented in the CAM array shown in FIG. 1A.
Figure 2:
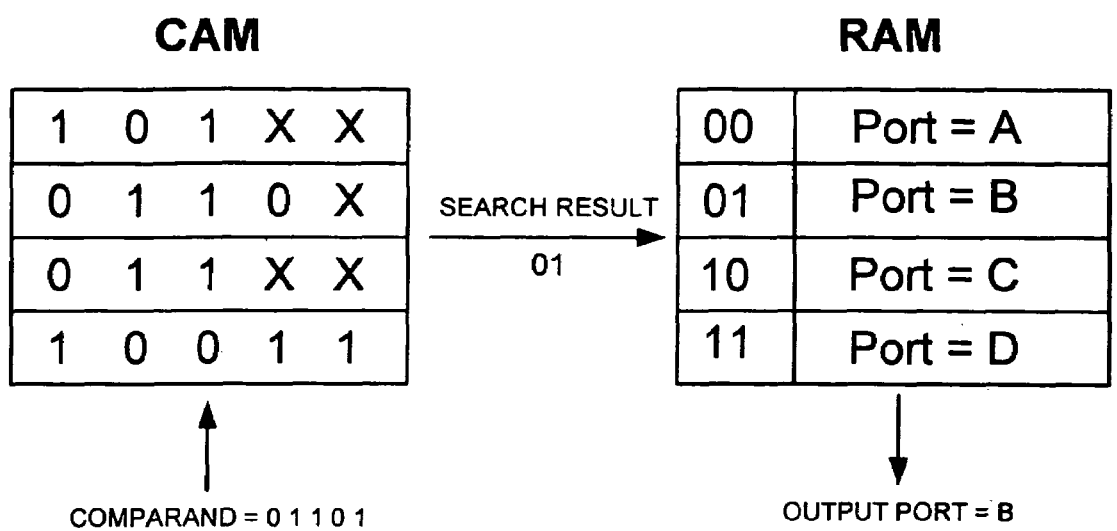
FIG. 2 illustrates how match data from the CAM array shown in FIG. 1A is used as an address of a RAM storing a list of output ports.
Figure 3:
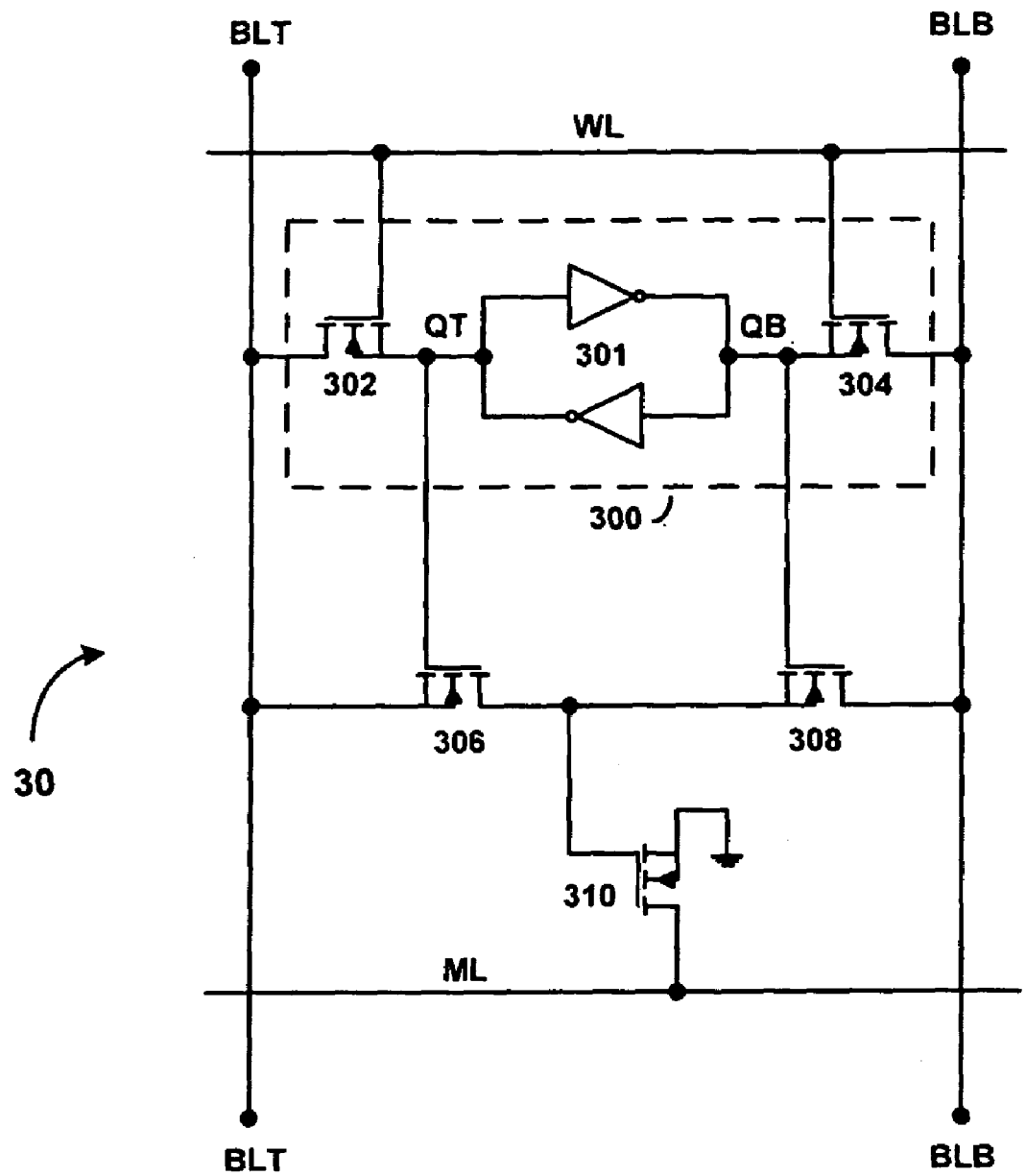
FIG. 3 is a schematic diagram of a prior art binary CAM (BCAM) cell.

Comparing the PCMD-based BCAM cell 50 (FIG. 5) of the present invention to the prior art SRAM-based BCAM cell 30 (FIG. 3) reveals numerous advantages. First, the PCMD-based BCAM cell 50 is substantially smaller in area than is the SRAM-based BCAM cell 30. Unlike the SRAM-based BCAM cell 30, which requires a total of nine transistors, the PCMD-based BCAM 50 only requires four transistors. The smaller cell size allows shorter bitlines, which results in lower dynamic power consumption. Second, elimination of the SRAM cell results in improved standby power, since in standby mode (i.e. static mode), the PCMD-based BCAM 50 consumes very little power. Third, unlike the SRAM-based BCAM cell 30, the PCMD-based BCAM cell 50 is nonvolatile, meaning that the cell 50 retains its data even after power is removed. SRAMs lose their data when power is removed. Consequently, the data must be rewritten into the SRAM each time the SRAM-based BCAM cell 30 is decoupled from its power source. Fourth, because chalcogenic devices are much more radiation hard compared to SRAMs, the PCMD-based BCAM cell 50 is much less susceptible to radiation induced soft errors.

Figure 15:
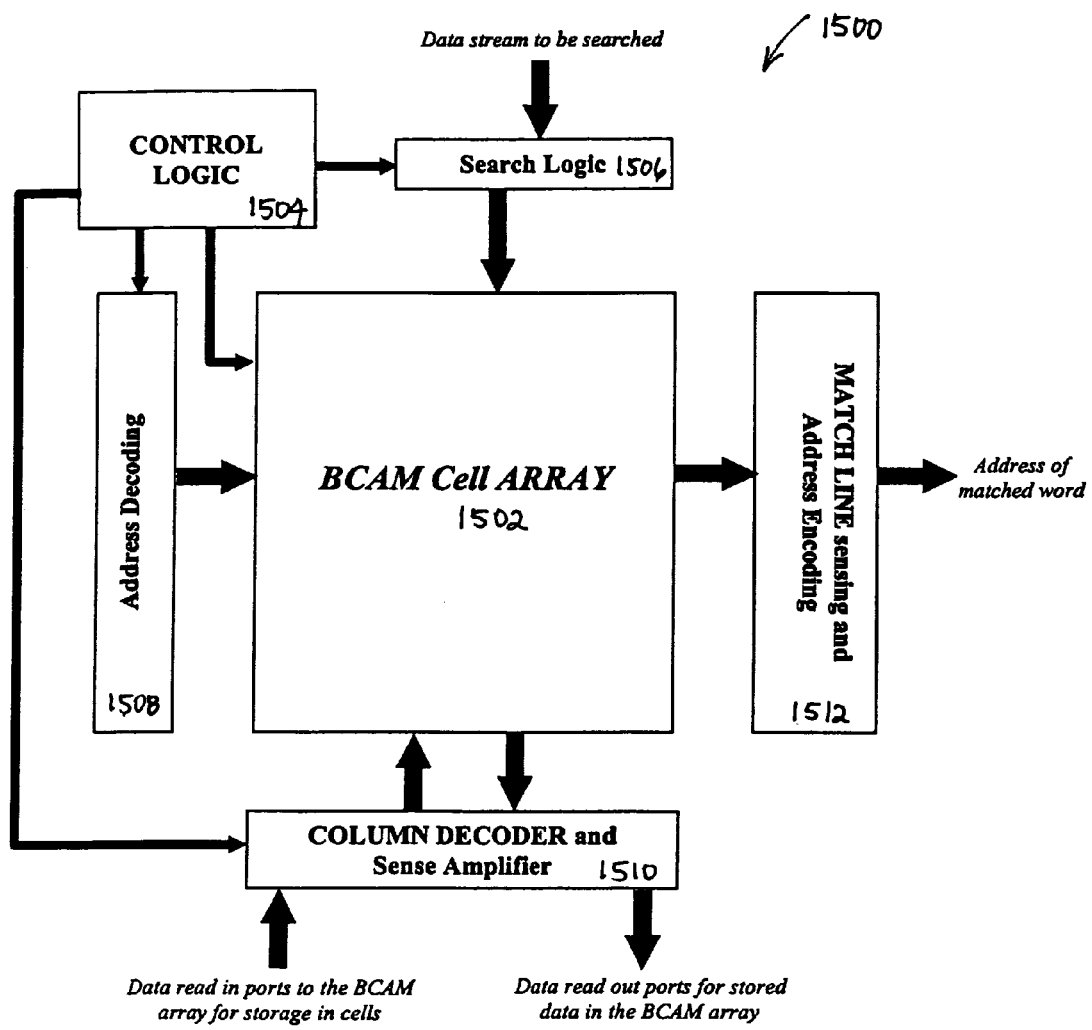
FIG. 15 is a block diagram of a BCAM memory block that includes a plurality of BCAM cells of the type shown in FIG. 5.
Figure 16:
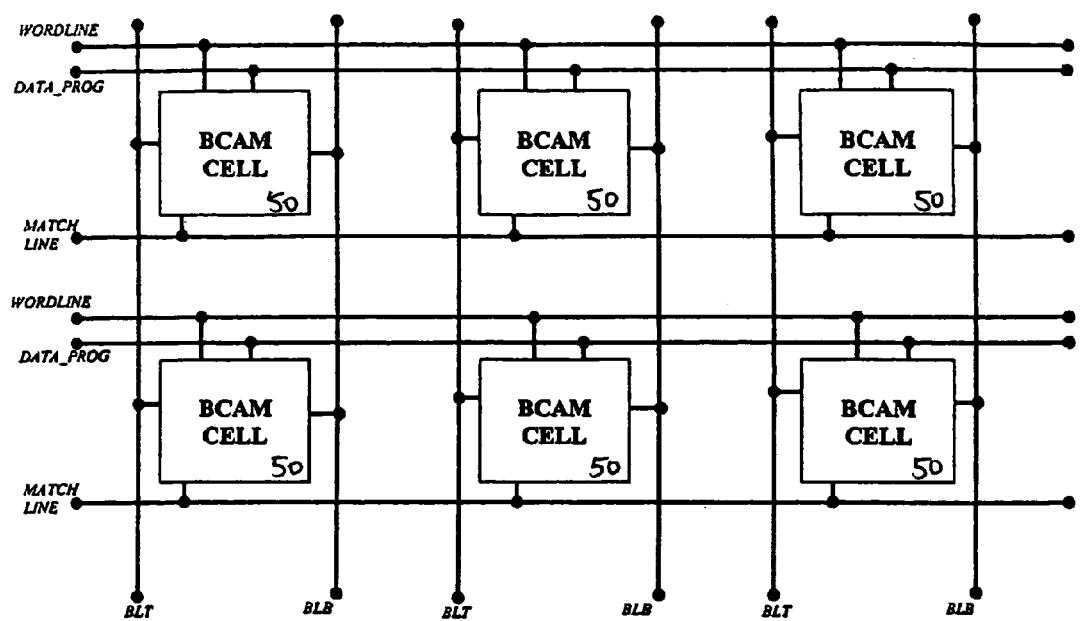
FIG. 16 is a block diagram illustrating how a plurality of BCAM cells of the type shown in FIG. 5 are configured in the BCAM memory block shown in FIG. 15.

According to an aspect of the invention, a plurality of BCAM cells 50 may be configured in an array to implement a multi-bit CAM. FIG. 15 is a block diagram of an exemplary BCAM memory block 1500 that includes a plurality of BCAM cells of the type shown in FIG. 5. The BCAM memory block 1500 comprises a BCAM cell array 1502, which is coupled to a control logic block 1504, a search logic block 1506, an address decoding block 1508, a column decoder and sense amplifier block 1510, and a ML address encoding and sense amplifier block 1512. The BCAM cell array 1502 is arranged in a plurality of rows, as shown in FIG. 16, with each row having an associated wordline (WL), data programming line (DATA_PROG) and matchline (ML). The control logic block 1504 translates command data into internal timing and data signals that control the functionality of the BCAM cell array 1502 and the search logic block 1506. The control logic 1504 also provides address data to the address decoding block 1508 and the column decoder and sense amplifier block 1510. The address data is decoded by the address decoding and column decoder and sense amplifier blocks 1508, 1510, so that the appropriate rows and columns of the BCAM cell array 1500 are activated for accessing. The search logic block 1506 is configured to receive a data stream to be searched and form a comparand (i.e. a multi-bit data word), which is compared to data stored in the plurality of rows of data bits stored in the BCAM cell array 1502. During a compare operation, every row of the BCAM cell array 1502 having data matching the comparand is coupled to the ML address encoding and sense amplifier block 1512, which generates an entry index based on the match results. The matched entry index is then provided as an output of the BCAM memory block 1500.

Figure 17:
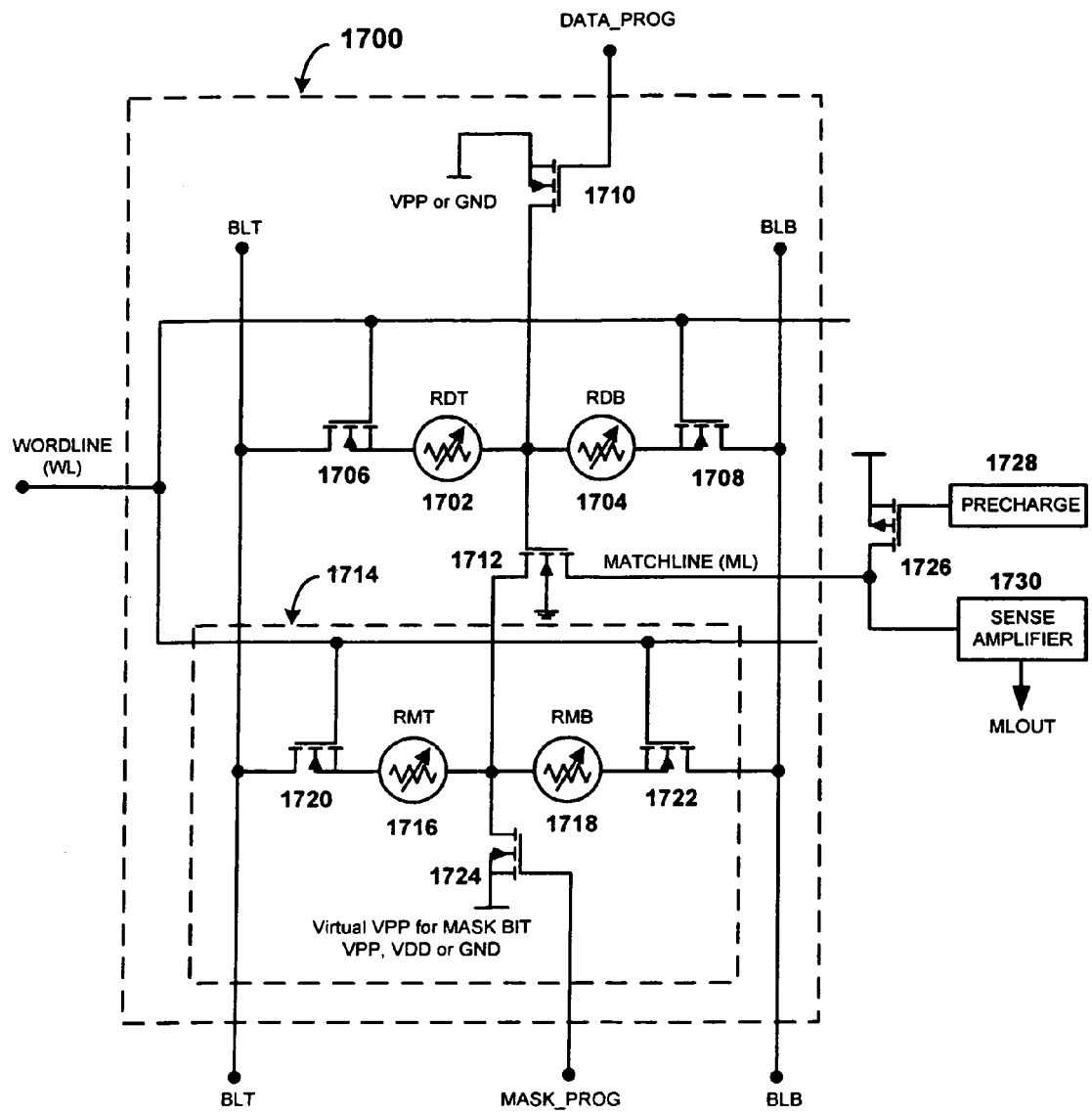
FIG. 17 is a schematic diagram of a TCAM cell, according to an embodiment of the present invention.

Referring now to FIG. 17, there is shown a schematic diagram of a TCAM cell 1700, according to an embodiment of the present invention. The TCAM cell 1700 comprises first and second PCMDs 1702, 1704 coupled to access transistors 1706, 1708, respectively, a programming transistor 1710, a matchline charge control transistor 1712, and a mask bit circuit 1714. The access transistor 1706, 1708 have gates coupled to a wordline (WL) and drains coupled to bitlines BLT (bitline true) and BLB (bitline bar). As shown, the ML of the TCAM cell 1700 is coupled to a precharge pull-up transistor 1726, which is controlled by precharge control input 1728, and a sense amplifier 1730. The mask bit circuit 1714 is coupled to the source of the matchline charge control transistor 1712, and is comprised of first and second mask bit PCMDs 1716, 1718, mask bit PCMD access transistor 1720, 1722, which are coupled to the first and second mask bit PCMDs 1716, 1718, respectively, and a mask bit setting transistor 1724.

FIG. 18 is a table showing the program states of the PCMDs in the TCAM cell of FIG. 17, when a logic "1" is stored in the TCAM cell 1700, when a logic "0" is stored in the TCAM cell 1700, and the states of the mask bit PCMDs 1716, 1718 required to turn the mask bit ON and OFF. When the mask bit is OFF (mask bit PCMDs 1716, 1718 programmed to low-resistance (i.e. SET) states), the ML discharges or remains in its precharged state, depending on whether the comparand matches the data stored in the TCAM cell 1700. This can be confirmed as follows.

Figure 19:
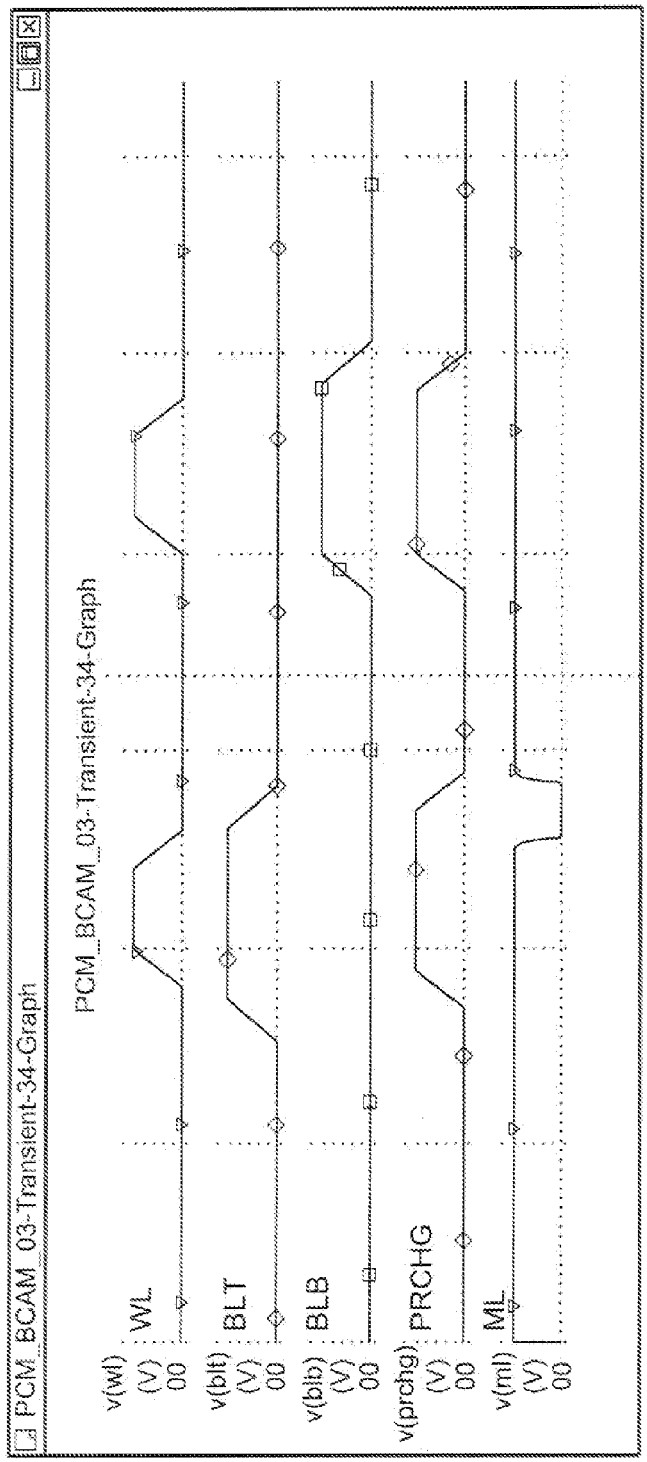
FIG. 19 is a simulation timing diagram showing exemplary waveforms applied to and generated by the TCAM cell of FIG. 17 during a compare operation when the mask bit is OFF.

First suppose that a logic "1" has previously been stored in the TCAM cell 1700 (PCMDs 1702, 1704 programmed to low-resistance (SET) and high-resistance (RESET) states, respectively), and the ML has been precharged to VDD. During the compare operation, the WL is raised high and the MASK_PROG terminal of the mask bit setting transistor 1724 is pulled low. When a data input having a logic "0" is compared to the stored logic "1", a logic "1" is applied to the BLT line and a logic "0" is applied to the BLB line. The voltages applied to the BLT and BLB lines are transferred, in a "resistor divider" fashion, onto the node connecting the first and second mask bit PCMDs 1716, 1718. Assuming that VDD is applied to the BLT line, 0V is applied to the BLB line, and the first and second mask bit PCMD access transistor 1720, 1722 are of identical size, 0.5 VDD initially appears at the node connecting the first and second mask bit PCMDs 1716, 1718. Additionally, since BLT is high and the first PCMD 1702 is in a low-resistance state, the matchline charge control transistor 1712 is turned ON. Because the ML is at a higher voltage (VDD) than the initial voltage of 0.5 VDD appearing on the node connecting the first and second mask bit PCMDs 1716, 1718, and because the matchline charge control transistor 1712 is ON, the ML begins to discharge through mask bit setting transistor 1724. As the ML discharges, the sense amplifier 1730 senses the drop and responds by driving the ML to a full swing logic "0". The pulling of the ML to a logic "0" level is indicative of a mismatch, as is shown in the left-half portion of FIG. 19.

By contrast, when the mask bit is OFF (mask bit PCMDs 1716, 1718 programmed to low-resistance (i.e. SET) states) and a logic "1" data input (BLT at logic "0" and BLB at logic "1") is compared to the logic "1" stored in the TCAM cell 1700, the gate of the matchline charge control transistor 1712 receives a logic low value (via first access transistor 1706 and low-resistance first PCMD 1702), which prevents the matchline charge control transistor 1712 from turning on. In other words, even though a voltage of 0.5 VDD is set at the node connecting the first ands second mask bit PCMDs 1716, 1718, while the ML is at a higher precharge voltage of VDD, the ML is prevented from discharging and remains floating at its precharged state. This is a state indicative of a match. (See right-half portion of FIG. 19.) Note that although the BLB line is at a logic "1", the logic "1" on the BLB cannot be passed to the gate of the matchline charge control transistor 1712, since the second PCMD 1704 had been previously programmed to a high-resistance (RESET) state.

Figure 20:
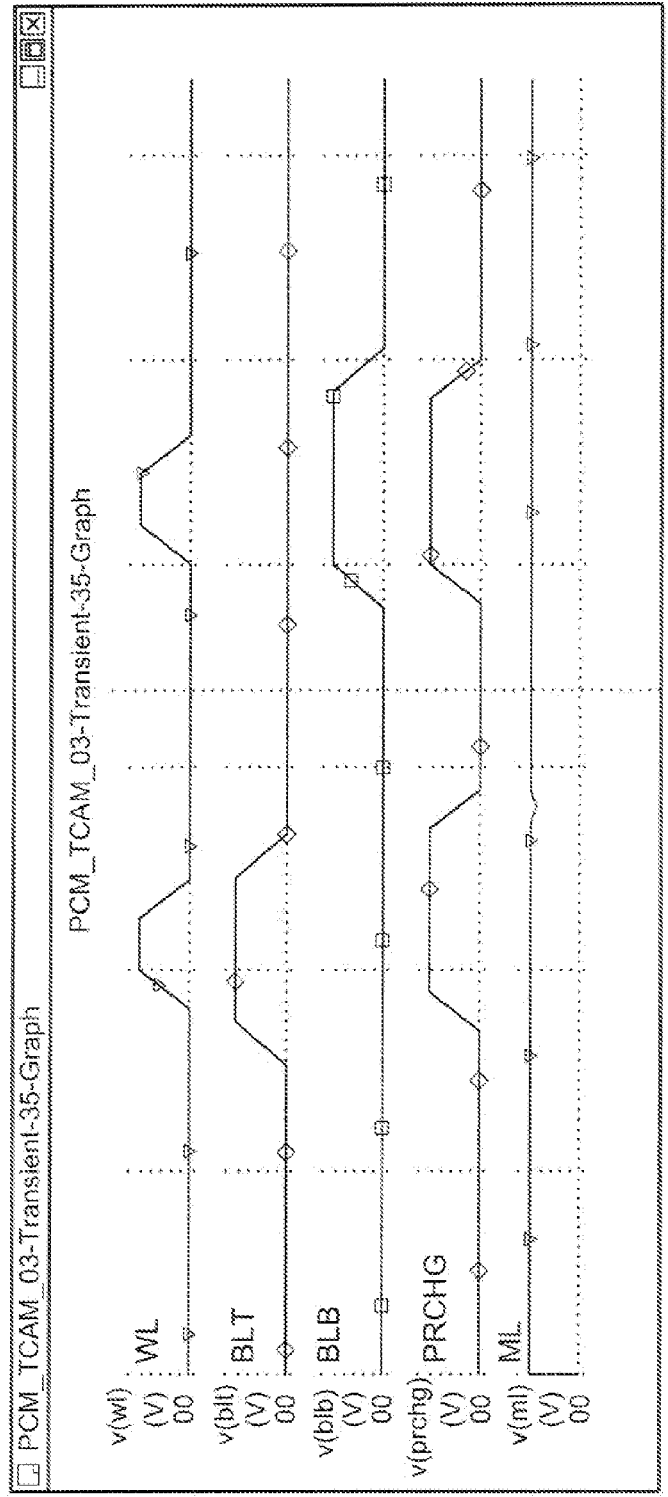

When the mask bit is ON (mask bit PCMDs 1716, 1718 programmed to high-resistance (i.e. RESET) states), the TCAM cell 1700 is in a "don't care" state, and the content of the cell 1700 is ignored or "masked off" during compare operations. The high-resistances presented by the mask bit PCMDs 1716, 1718 can be viewed as open circuits, which deny any path through which the charge on the ML can discharge. Accordingly, during a compare operation, the sense amplifier 1730 drives the ML to a full logic "1" state, and does so irrespective of what the logic value of the comparand is. In other words, when the mask bit is ON in the TCAM cell 1700, a match is always indicated regardless of whether there is a match or a mismatch. This is illustrated in FIG. 20, where it is 'shown that the ML always remains in its precharged state, regardless of the data being compared.

FIG. 21 is a table showing programming voltages used to program the PCMDs 1702, 1704, 1716 and 1718 of the TCAM cell 1700 (FIG. 17) to either high-resistance or low-resistance states. Programming the PCMDs 1702, 1704, 1716 and 1718 is performed similar to that described above for programming the PCMDs 500, 502 in the BCAM cell 50 shown in FIG. 5. The TCAM cell 1700 may also be read similar to that described above for the BCAM cell 50.

Figure 4:
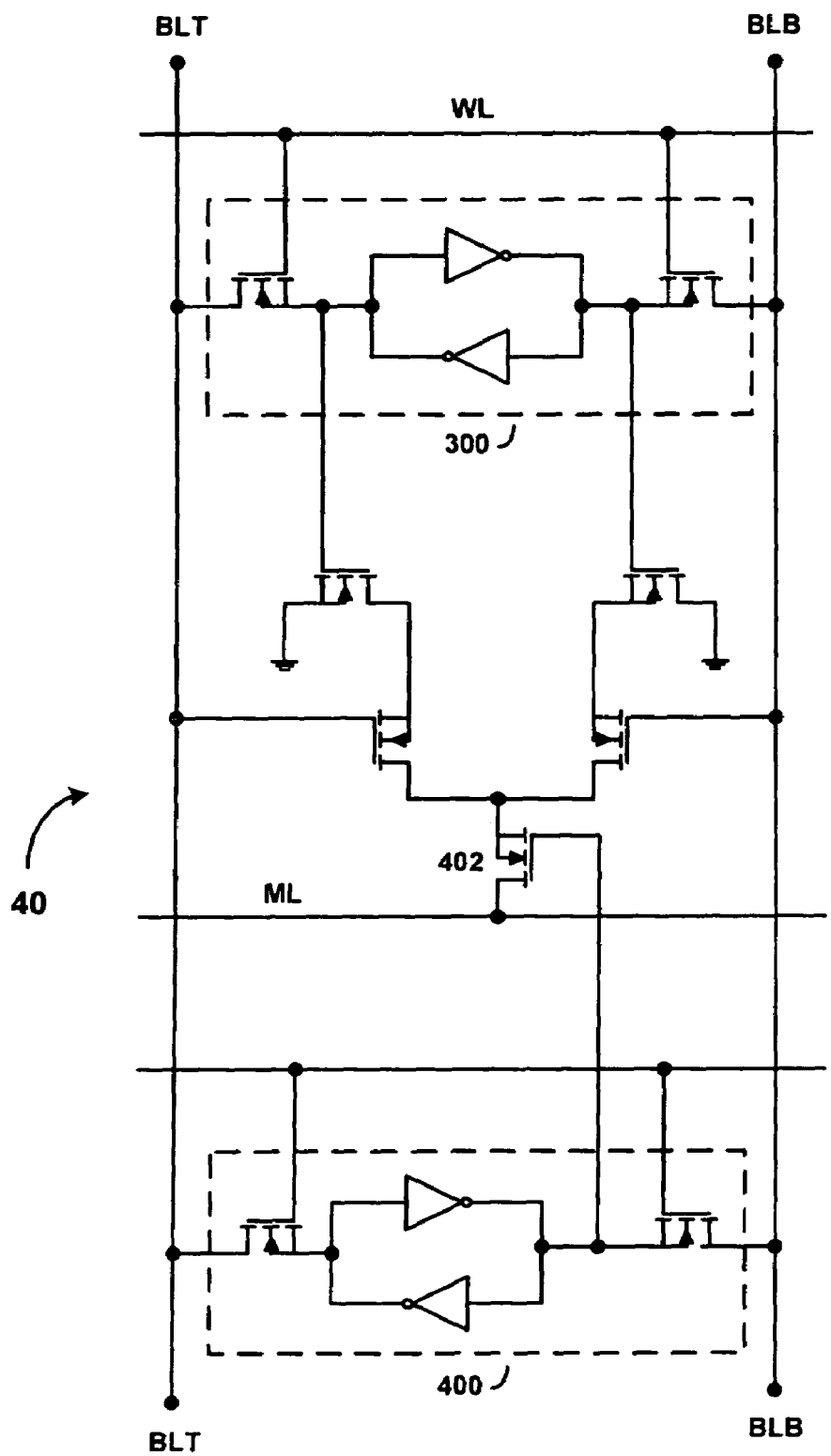
FIG. 4 is a schematic diagram of a prior art ternary CAM (TCAM) cell.

Comparing the PCMD-based TCAM cell 1700 (FIG. 17) of the present invention to the prior art SRAM-based TCAM cell 40 (FIG. 4) reveals numerous advantages. First, the PCMD-based TCAM cell 1700 is substantially smaller in area than is the SRAM-based TCAM cell 40. Unlike the SRAM-based TCAM cell 40, which requires a total of seventeen transistors, the PCMD-based TCAM 1700 only requires seven transistors. The smaller cell size allows shorter bitlines, which results in lower dynamic power consumption. Second, elimination of the SRAM cells results in improved standby power, since in standby mode (i.e. static mode), the PCMD-based TCAM 1700 consumes very little power. Third, unlike the SRAM-based TCAM cell 40, the PCMD-based TCAM cell 1700 is nonvolatile, meaning that the cell 1700 retains its data even after power is removed. SRAMs lose their data when power is removed. Consequently, the data must be rewritten into the SRAMs each time the SRAM-based TCAM cell 40 is decoupled from its power source. Fourth, because chalcogenic devices are much more radiation hard compared to SRAMs, the PCMD-based TCAM cell 1700 is much less susceptible to radiation induced soft errors.

Figure 22:
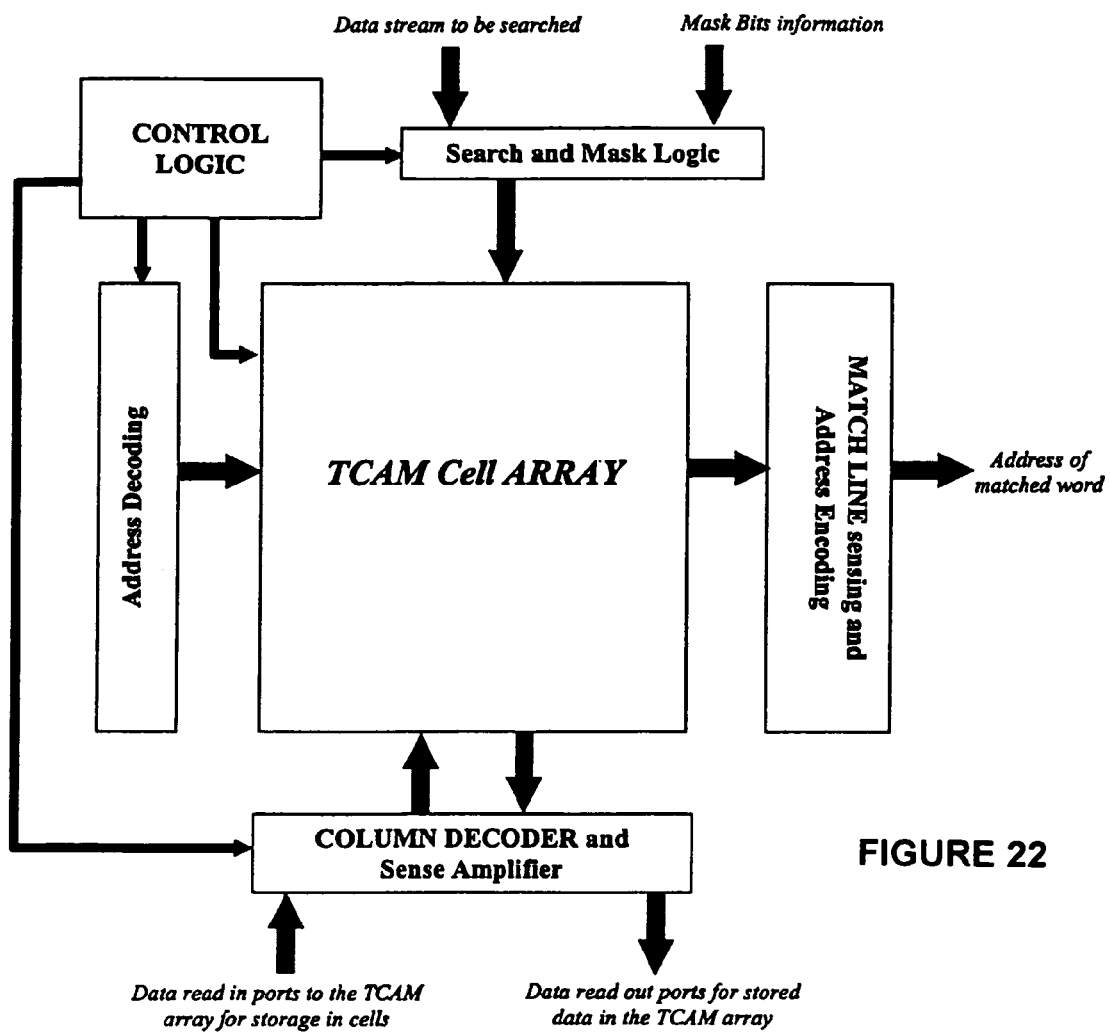
FIG. 22 is block diagram of a TCAM memory block that includes a plurality of TCAM cells of the type shown in FIG. 17.

FIG. 22 is block diagram of a TCAM memory block that includes a plurality of TCAM cells of the type shown in FIG. 17. The functions of the various blocks are similar to that described above in connection with FIG. 16.

Figure 23:
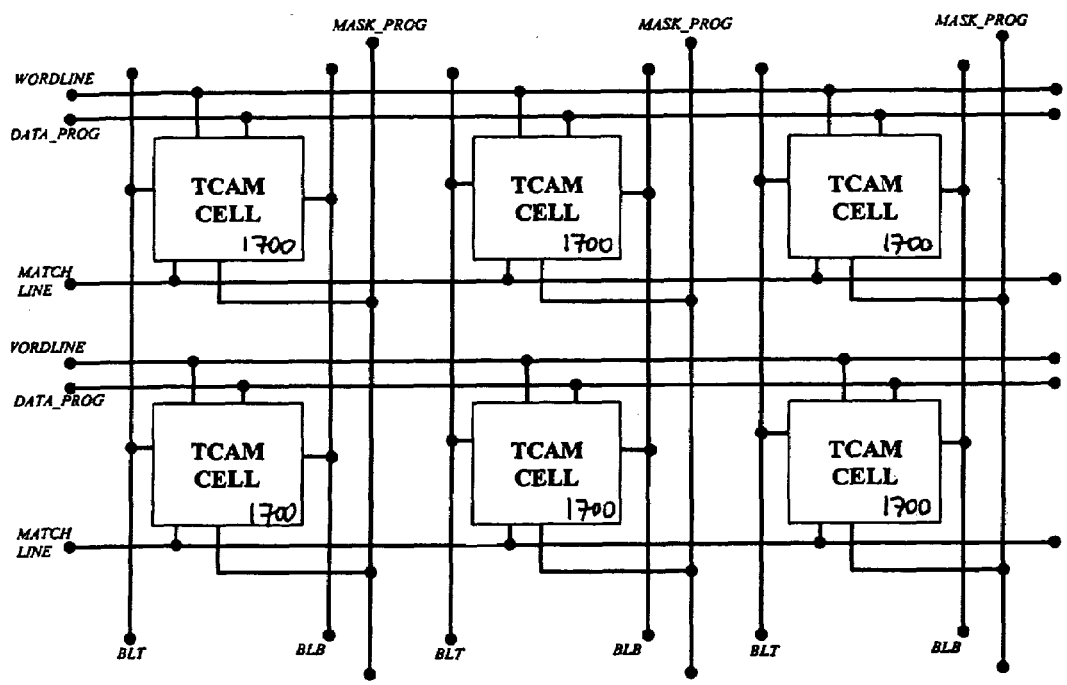
FIG. 23 is a block diagram illustrating how a plurality of TCAM cells of the type shown in FIG. 17 are configured in the TCAM memory block shown in FIG. 22.

FIG. 23 is a block diagram illustrating how a plurality of TCAM cells of the type shown in FIG. 17 are configured in the TCAM memory block shown in FIG. 22. Like the BCAM cell array 1502 configuration shown in FIG. 16, each row of the TCAM cell array has an associated wordline (WL), data programming line (DATA_PROG) and matchline (ML).

Figure 24:
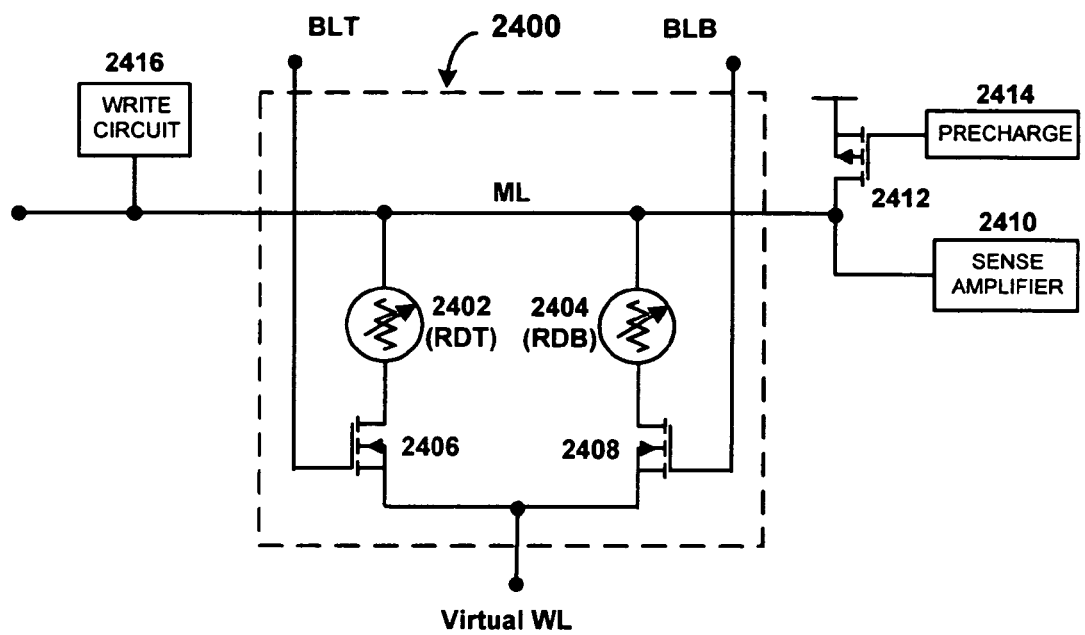
FIG. 24 is a schematic diagram of a universal CAM (UCAM) cell, according to an embodiment of the present invention.

Referring now to FIG. 24, there is shown a schematic diagram of a universal CAM (UCAM) cell 2400, according to an embodiment of the present invention. The UCAM cell 2400 is referred to as "universal" since, depending on the program states of its PCMDs, is capable of operating as either a BCAM or a TCAM. The UCAM cell 2400 comprises first and second PCMDs 2402, 2404 and first and second access transistors 2406, 2408. The first and second PCMDs 2402, 2404 have first ends that are individually coupled between the drains of the first and second access transistors 2406, 2408 and a matchline (ML). The gates of the first and second access transistors 2406, 2408 are coupled to bitlines BLT and BLB, respectively. Finally, the sources of each of the first and second access transistors 2406, 2408 are coupled to a virtual wordline (WL). Similar to the BCAM cell 50 (FIG. 5) and TCAM cell 1700 (FIG. 17), the ML of the UCAM cell 2400 is also coupled to a sense amplifier 2410 and to a precharge pull-up transistor 2412, which is controlled by precharge control input 2414. The ML is also coupled to a write circuit 2416, which is used to program the first and second PCMDs 2402, 2404, as will be described in more detail below.

FIG. 25 is a table showing the program states of the first and second PCMDs 2402, 2404 employed in the UCAM cell 2400 of FIG. 24, when a logic "1" is stored in the UCAM cell 2400, when a logic "0" is stored in the UCAM cell 2400, and the states of first and second PCMDs 2402, 2404 required to implement a mask bit function. For example, a logic "1" is stored in the UCAM cell 2400 by programming the first PCMD 2402 to a low-resistance (SET) state and programming the second PCMD 2404 to a high-resistance (RESET) state. To store a logic "0" in the UCAM cell 2400, the first and second PCMDs 2402, 2404 are programmed to high-resistance and low-resistance states, respectively. To implement a mask bit function, both the first and second PCMDs 2402, 2404 are programmed to high-resistance states.

During a compare operation, the virtual WL is pulled to GND. To compare a data input having a logic "0" value to a logic "1" stored in the UCAM cell 2400, the ML is pulled low and discharges to GND, thereby indicating a mismatch. That a mismatch occurs under such conditions is confirmed by the following observations. First, when an input data having a logic "0" value is input to the UCAM cell 2400, the BLT and BLB lines are coupled to a logic "1" and a logic "0", respectively. Under these bias conditions, the first access transistor 2406 is turned ON, while the second access transistor is turned OFF. Because the first PCMD 2402 is programmed to a low-resistance state, the ML begins to discharge to ground. As the ML discharges, the sense amplifier 2410 senses the drop and responds by driving the ML to a full swing logic "0". A logic "0" on the ML indicates that the data input of logic "0" does not match the logic "1" stored in the UCAM cell 2400.

By contrast, when a logic "1" data input (BLT at logic "0" and BLB at logic "1") is compared to the logic "1" stored in the UCAM cell 2400, the ML is prevented from discharging through the second access transistor 2408, since the second PCMD 2404 has been programmed to a high-resistance state. The ML also cannot discharge through the first access transistor 2406, since it is turned OFF (logic "0" applied to the gate of the first access transistor 2406). The sense amplifier 2410 senses that the ML is prevented from discharging and maintains the ML at is precharged logic "1" state, which is indicative of a match condition.

In addition to having the functionality of a BCAM cell, the UCAM cell 2400 may also implement a mask bit function. To turn the mask bit ON, both of the PCMDs are programmed to high-resistance states. Under such programmed conditions, the ML of the UCAM cell 2400 is prevented from being coupled to ground, irrespective of the logic values applied to the BLT and BLB lines. Hence, under such programmed conditions, the UCAM cell 2400 functions as a don't care, i.e., functions as a TCAM cell with its mask bit ON.

FIG. 26 is a table showing programming voltages used to program the first and second PCMDs 2402, 2404 of the UCAM cell 2400 of FIG. 24 to either high-resistance or low-resistance states. As an example, to program the first PCMD 2402 to a low-resistance state, the BLT line is coupled to a programming voltage, Vprg, the BLB line and the virtual WL are both coupled to GND, the precharge control input 2414 of the precharge pull-up transistor 2412 is coupled to VDD; and the write circuit 2416 is configured to provide a programming pulse, VPP. Because the precharge pull-up transistor 2412 has VDD coupled to the precharge control input, the precharge pull-up transistor 2412 remains OFF. The Vprg voltage applied to the first access transistor 2406 turns the first access transistor 2406 ON. Further, because the virtual WL is coupled to ground, a current path to ground is formed from the write circuit 2416, via the first PCMD 2402 and the first access transistor 2406. The VPP pulse is given a long enough duration to heat the heater element of the first PCMD 2402. Once sufficient joule heating has been transferred to the PCM of the first PCMD 2402, the VPP pulse is allowed to gradually ramp down so that the PCM of the first PCMD 2402 solidifies into a crystalline, low-resistance state. Programming the first and second PCMDs 2402, 2404 to low-resistance or high-resistance states is performed in a similar fashion, using the programming voltages listed in the table in FIG. 26.

The data stored in the UCAM cell 2400 may be read out through either the BLT or BLB lines. FIG. 27A is a table illustrating the voltages applied to the UCAM cell 2400 to read the stored data through the BLT line. If the UCAM cell 2400 is programmed to store a logic "1" (first PCMD 2402 programmed to a low-resistance state and second PCMD 2404 programmed to a high-resistance state; see FIG. 25), under the bias conditions indicated in the table, the ML will discharge quickly. This discharging will be sensed by the sense amplifier 2410, thereby indicating a logic "1" is stored in the UCAM cell 2400. On the other hand, if a logic "0" is stored in the UCAM cell 2400 (first PCMD 2402 programmed to a high-resistance state and second PCMD 2404 programmed to a low-resistance state; see FIG. 25), the ML will discharge slowly, and under appropriate timing, the sense amplifier 2410 will register a state opposite to that when a logic "1" is stored in the UCAM cell 2400. FIG. 27B shows the biasing used to read the data from the UCAM cell 2400 through the BLB line. The operation is similar to that for when the data is read out through the BLT line.

In standby mode. (i.e. static mode), the UCAM cell 2400 can be placed in a state where virtually no leakage occurs from the cell. To conform to this state, all that needs to be done is to bias the BLB and BLT lines to ground, which turns OFF both of the first and second access transistors 2406 and 2408. Subthreshold currents from the first and second access transistors 2406 and 2408 can also be essentially eliminated by raising the virtual WL to a higher voltage (e.g. closer to the precharged ML voltage of VDD).

Comparing the PCM-based UCAM cell 2400 of the present invention to the prior art SRAM-based TCAM cell 40 (FIG. 4) reveals numerous advantages. First, the PCMD-based UCAM cell 2400 is substantially smaller in area than is the SRAM-based TCAM cell 40. Unlike the SRAM-based TCAM cell 40, which requires a total of seventeen transistors, the PCMD-based UCAM 2400 only requires two transistors. The smaller cell size allows shorter bitlines, which results in lower dynamic power consumption. Second, elimination of the SRAM cells results in improved standby power, since as described in the previous paragraph, in standby mode (i.e. static mode), the PCMD-based UCAM 2400 consumes very little power. Third, unlike the SRAM-based TCAM cell 40, the PCMD-based UCAM cell 2400 is nonvolatile, meaning that the state of the cell 2400 retains its data even after power is removed. SRAMs lose their data when power is removed. Consequently, the data must be rewritten into the SRAMs each time the SRAM-based TCAM cell 40 is decoupled from its power source. Fourth, because chalcogenic devices are much more radiation hard compared to SRAMs, the PCMD-based UCAM cell 2400 is much less susceptible to radiation induced soft errors.

Figure 28:
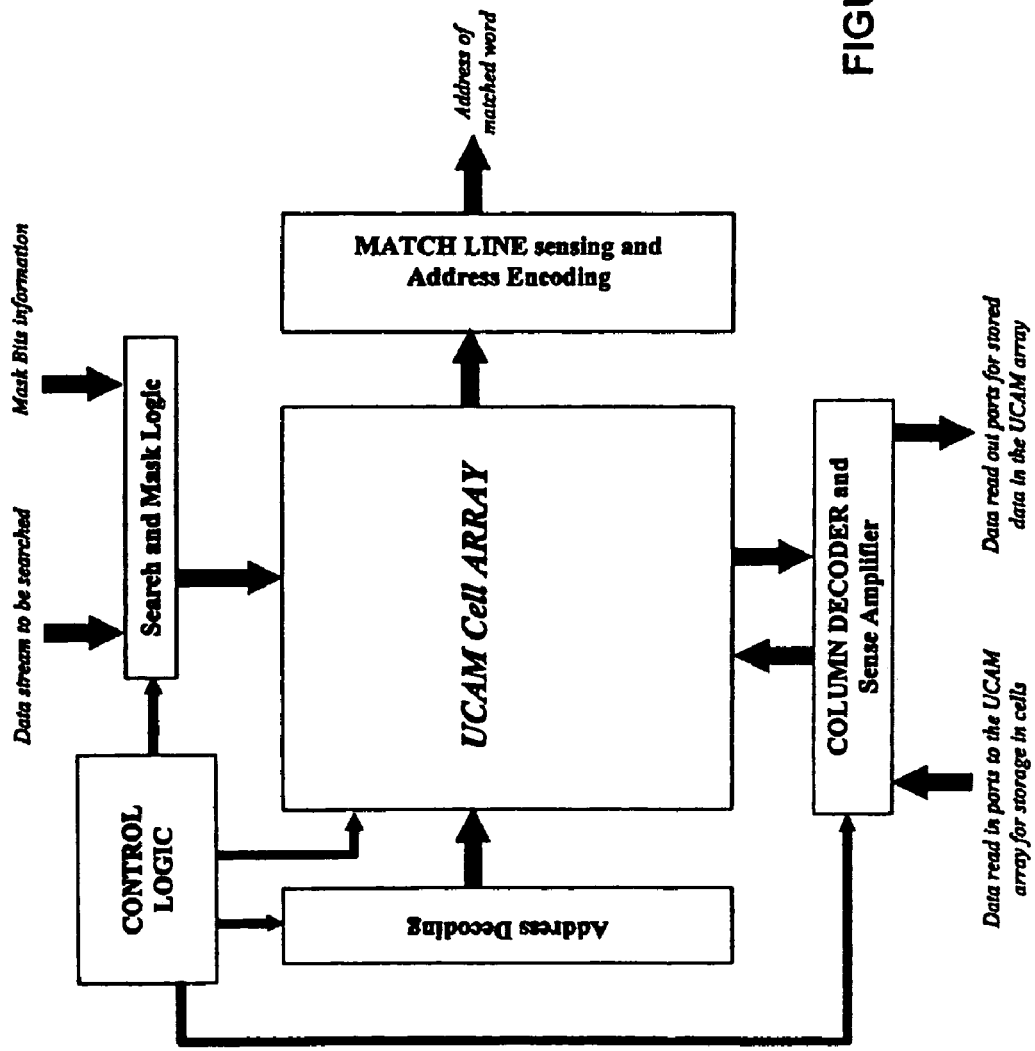
FIG. 28 is a block diagram of a UCAM memory block that includes a plurality of UCAM cells of the type shown in FIG. 24.

FIG. 28 is block diagram of a UCAM memory block that includes a plurality of UCAM cells of the type shown in FIG. 24. The functions of the various blocks are similar to that described above in connection with FIGS. 16 and 22.

Figure 29:
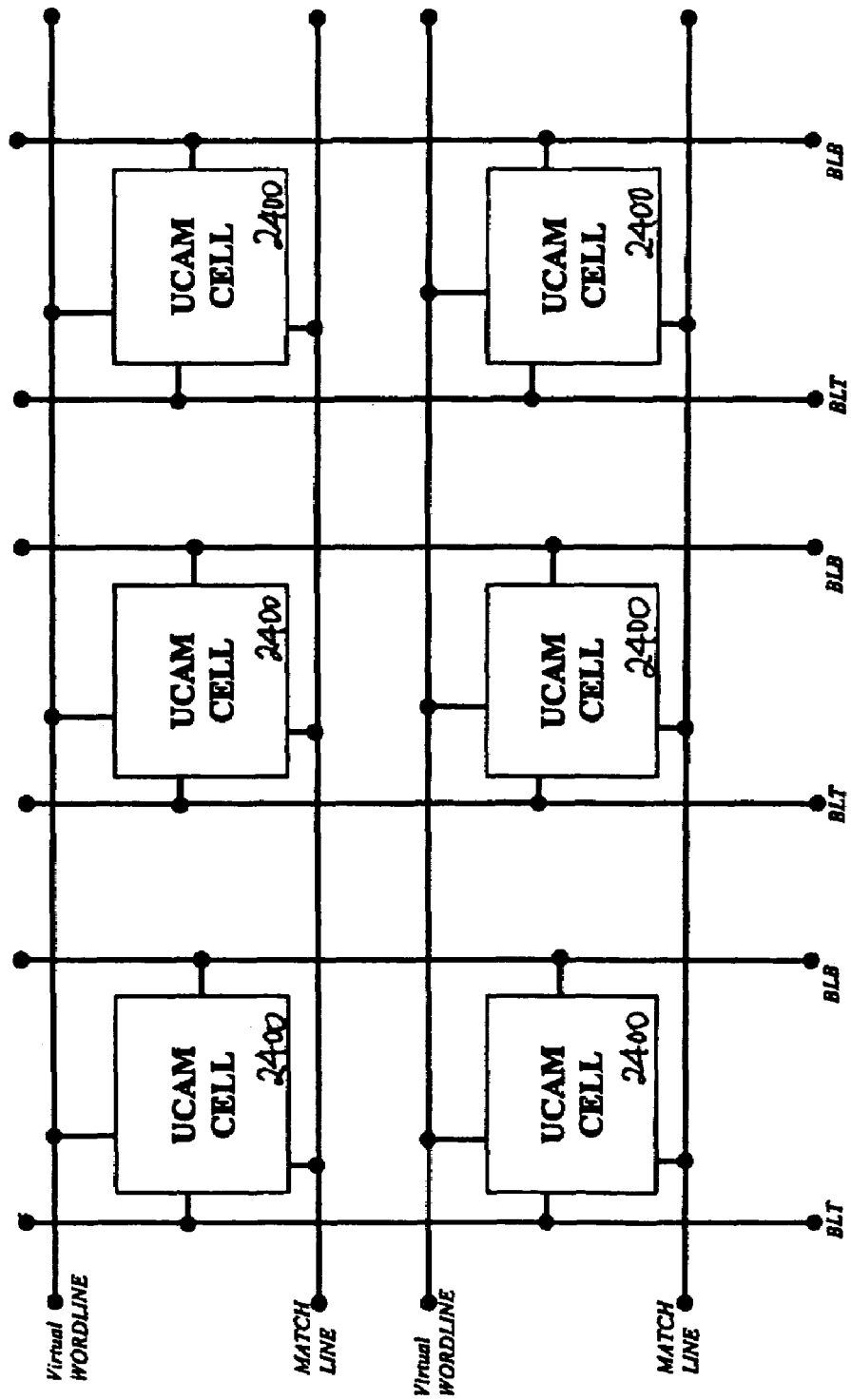
FIG. 29 is a block diagram illustrating how the plurality of UCAM cells of the type shown in FIG. 24 are configured in the UCAM memory block shown in FIG. 28.

FIG. 29 is a block diagram illustrating how a plurality of UCAM cells of the type shown in FIG. 24 are configured in the TCAM memory block shown in FIG. 28. Each row of the UCAM cell array has an associated virtual wordline (WL) and matchline (ML).

While particular embodiments of the present invention have been shown and described, it will be obvious to those skilled in the art that, based upon the teachings herein, changes and modifications may be made without departing from this invention and its broader aspects. Accordingly, the appended claims are intended to encompass within their scope all such changes and modifications as are within the true spirit and scope of the described inventions.

What is claimed is:

1. A content-addressable memory (CAM) cell comprising:
    a first phase change material device (PCMD);
    a first access transistor coupled in series with said first PCMD having a control terminal coupled to a bitline;
    a matchline coupled to said series-connected first PCMD and first access transistor, said matchline configured to discharge or not discharge, depending on whether a logic value of a comparand and a programming state of said first PCMD satisfy a predetermined criterion;
    a second PCMD; and
    a second access transistor coupled in series with said second PCMD, wherein said series-connected second PCMD and second access transistor is coupled between a wordline and said matchline.

2. The (CAM) CAM cell of claim 1 wherein program states of said first and second PCMDs determine whether a logic "0" or a logic "1" is being stored by said CAM cell.

3. The CAM cell of claim 1, wherein said CAM cell is configured to operate as a binary CAM cell or a ternary CAM cell, depending on program states of said first and second PCMDs.

4. A content-addressable memory (CAM) cell, comprising:
    first and second phase change material devices (PCMDs) selectively coupled between a matchline and a wordline;
    a first access transistor coupled in series with said first PCMD having a control input configured to receive a bitline signal from a bitline that determines whether said first PCMD is coupled between said matchline and said wordline; and
    a second access transistor coupled in series with said second PCMD having a control input configured to receive an inverse bitline signal from an inverse bitline that determines whether said second PCMD is coupled between said matchline and said wordline,
    wherein said matchline is configured to either remain in a precharged state or discharge from the precharged state during a compare operation, depending on program states of said first and second PCMDs.

5. The CAM cell of claim 4 wherein program states of said first and second PCMDs determine whether the CAM cell stores a logic "0" or a logic "1".

6. The CAM cell of claim 4 wherein program states of said first and second PCMDs determine whether a "don't care" operation is performed during said compare operation.

* * * * *